United States Patent
Hirai et al.

[19]

[11] Patent Number: 6,160,526
[45] Date of Patent: Dec. 12, 2000

[54] IC MODULE AND IC CARD

[75] Inventors: Minoru Hirai; Shigeyuki Ueda; Osamu Miyata; Tomoharu Horio, all of Kyoto, Japan

[73] Assignee: Rohm Co., Ltd., Kyoto, Japan

[21] Appl. No.: 09/242,748

[22] PCT Filed: Jun. 23, 1998

[86] PCT No.: PCT/JP98/02833

§ 371 Date: Feb. 22, 1999

§ 102(e) Date: Feb. 22, 1999

[87] PCT Pub. No.: WO98/59318

PCT Pub. Date: Dec. 30, 1998

[30]   Foreign Application Priority Data

| | | | |
|---|---|---|---|
| Jun. 23, 1997 | [JP] | Japan | 9-166318 |
| Jun. 23, 1997 | [JP] | Japan | 9-166319 |
| Jun. 23, 1997 | [JP] | Japan | 9-166320 |
| Jul. 17, 1997 | [JP] | Japan | 9-192204 |
| Jul. 24, 1997 | [JP] | Japan | 9-198037 |
| Sep. 30, 1997 | [JP] | Japan | 9-265548 |
| Oct. 29, 1997 | [JP] | Japan | 9-297427 |

[51] Int. Cl.[7] ............ H01L 23/02; H01Q 1/36; G06K 19/06

[52] U.S. Cl. .................. 343/895; 257/679; 235/491
[58] Field of Search ................ 343/895, 700 MS; 235/491, 487, 492, 380; 257/679, 780

[56]   References Cited

U.S. PATENT DOCUMENTS

| | | | |
|---|---|---|---|
| 3,465,346 | 9/1969 | Patterson et al. | 343/895 |
| 5,541,399 | 7/1996 | De Vall | 235/491 |
| 5,705,852 | 1/1998 | Orihara et al. | 257/679 |
| 5,852,289 | 12/1996 | Masahiko | 235/492 |

FOREIGN PATENT DOCUMENTS

| | | |
|---|---|---|
| 5-166018 | 7/1993 | Japan . |
| 9-8536 | 1/1997 | Japan . |

*Primary Examiner*—Don Wong
*Assistant Examiner*—James Clinger
*Attorney, Agent, or Firm*—Merchant & Gould P.C.

[57]   ABSTRACT

An IC module incorporated in an IC-card includes a substrate, an IC chip mounted on the substrate, and an antenna coil electrically connected to the IC chip. The antenna coil includes a conductive film which is patterned on a surface of the substrate, thereby facilitating fabrication of the IC module while realizing a thickness reduction of the IC module.

34 Claims, 24 Drawing Sheets

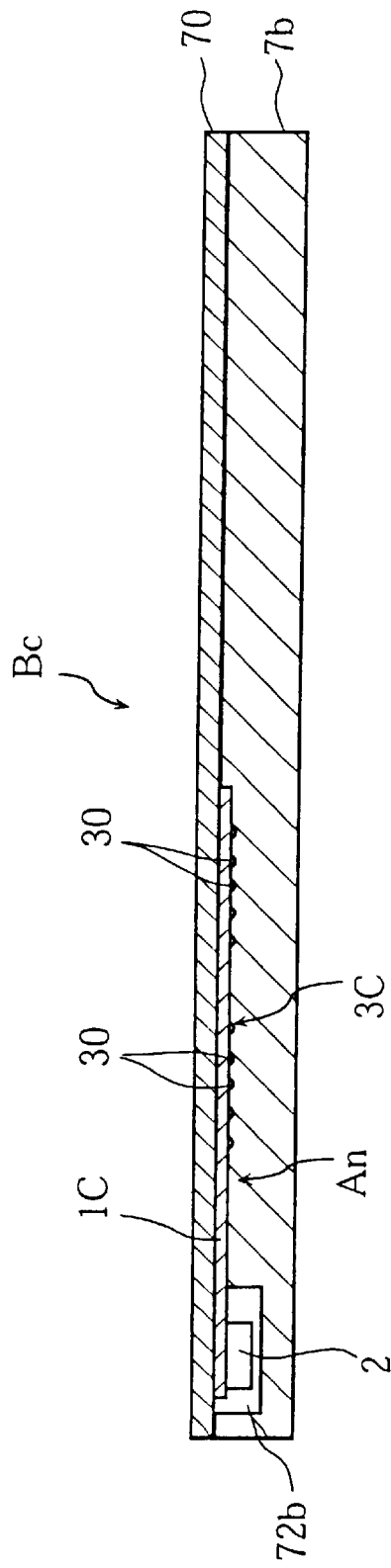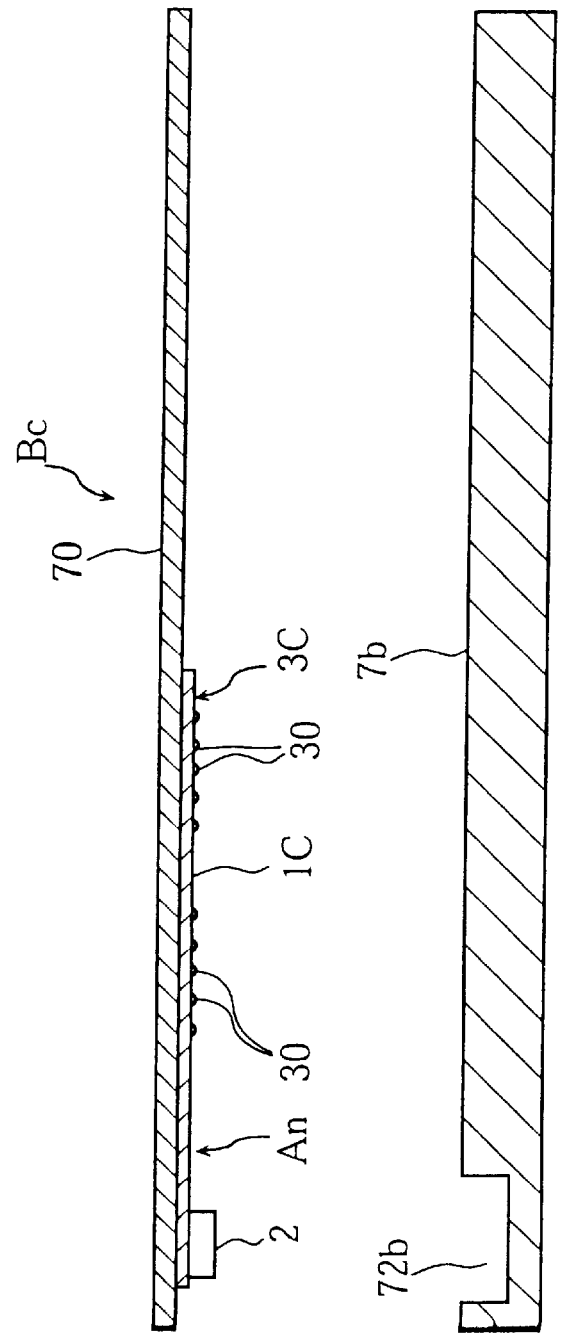

IC MODULE AND IC CARD

TECHNICAL FIELD

The present invention relates to an IC module which is a component of an IC-card used as an ID card or the like. It also relates to an IC-card including such an IC module.

BACKGROUND ART

An IC-card having an IC memory is known as a card having an information storage function. Recently, a non-contact IC-card has been in practical use as a prepaid card for use of ski lifts or the like. Such an IC-card includes an IC chip incorporated in a card member made of a synthetic resin. More particularly, the IC-card comprises an IC module which is incorporated in a card member made of a synthetic resin and having a predetermined thickness, and the IC-card module comprises an electronic circuit including an IC memory and an antenna coil.

The antenna coil not only provides its inherent function as an antenna for transmitting and receiving radio waves but also has a function of supplying a drive power to the IC chip by inductively generating an electromotive force upon receiving radio waves. Therefore, an IC-card incorporating an antenna coil can eliminate the need for incorporating a power source. Such an IC-card requires a further thickness reduction.

A conventional antenna coil utilizes a wire-wound coil formed of a metal wire. The wire-wound coil has a structure in which the metal wire is wound about 50 turns, for example, so that it has a large thickness. If the number of wire turns is reduced in order to reduce the thickness of the wire-wound coil, the properties of the antenna may be degraded. Consequently, the wire-wound coil becomes inevitably bulky, and there is a limitation on the thickness reduction of an IC-card. Further, in manufacturing the IC-card, the wire-wound coil and the IC chip, prepared separately, need to be aligned with each other, and the ends of the wire-wound coil must be connected to the electrodes of the IC chip in such a manner that they do not positionally deviate relative to each other. Accordingly, the series of the manufacturing steps is very complicated to result in a poor production efficiency. Furthermore, the wire-wound coil is liable to disconnection when the IC-card is deformed under bending for example.

DISCLOSURE OF THE INVENTION

An object of the present invention is to provide an IC module and an IC-card capable of solving or reducing the above problems.

A first aspect of the present invention provides an IC module. The IC module comprises a substrate, an IC chip mounted on the substrate, and an antenna coil electrically connected to the IC chip, wherein the antenna coil includes a conductive film which is patterned on a surface of the substrate.

Preferably, the IC chip has a main surface formed with a pair of electrodes for antenna connection. The antenna coil includes a spiral portion having a plurality of spiral turns. The substrate is provided with a pair of terminals disposed inwardly of the spiral portion in connection to starting and terminating ends, respectively, of the antenna coil. The IC chip is mounted on the substrate with the pair of electrodes connected to the pair of terminals.

Preferably, the antenna coil further includes a bent extension which extends inwardly of the spiral portion from the respective spiral turns. The bent extension includes the starting and terminating ends of the antenna coil, whereby the pair of terminals are located inwardly of the spiral portion.

Preferably, the bent extension has an inner end interposed between the starting and terminating ends of the antenna coil.

Preferably, the main surface of the IC chip is rectangular in plan view. The pair of electrodes for antenna connection are disposed at corners of the main surface on a common diagonal line.

Preferably, the main surface of the IC chip is provided with at least one dummy electrode. The substrate is provided with a dummy terminal corresponding to the dummy electrode, and the dummy electrode is connected to the dummy terminal.

Preferably, the substrate comprises a flexible substrate made of a resin film as a base material.

Preferably, the IC module further comprises a film having a surface formed with a conductor pattern which is symmetrical or substantially symmetrical to the pattern of the antenna coil. The substrate and the film material are bonded to each other to bring the conductive film pattern of the antenna coil into connection to the conductor pattern of the film.

Preferably, the film has a hole for avoiding interference of the film with the IC chip.

Preferably, the substrate and the film are bonded to each other via an anisotropic conductive film comprising conductive particles dispersed in an insulating resin.

Preferably, the IC module further comprises an adhesive layer for bonding the substrate and the IC chip to each other, and a bond assisting layer disposed at a portion of the substrate for adhesion to the adhesive layer. The bond assisting layer is made of a material having a higher adhesion to the adhesive layer than the substrate.

Preferably, the bond assisting layer is provided by the conductive film which also provides the antenna coil.

Preferably, a part of the antenna coil provides the bond assisting layer.

Preferably, the adhesive layer comprises an anisotropic conductive film including conductive particles dispersed in an insulating resin.

Preferably, the substrate has weakening means adjacent the IC chip.

Preferably, the weakening means comprises a plurality of perforations penetrating through the substrate around the IC chip.

Preferably, the IC module further comprises a sealing member for enclosing the IC chip.

Preferably, the sealing member has weakening means.

Preferably, the weakening means comprises a perforation which penetrates through the sealing member in its thickness direction.

Preferably, the weakening means comprises a recess formed on an obverse surface of the sealing member.

Preferably, the weakening means comprises a plurality of weakening portions arranged to surround the IC chip in plan view.

Preferably, the IC chip is mounted at a central portion of the substrate. The substrate is formed with a plurality of slits extending from a peripheral edge of the substrate toward the central portion.

Preferably, the IC chip is mounted at a central portion of the substrate. The substrate is shaped like a gear or a starfish in plan view with a plurality of projections extending radially from a portion of the substrate on which the IC chip is mounted.

Preferably, the antenna coil is shaped like a gear or a starfish in plan view in conformity with the shape of the substrate.

Preferably, the sealing member is shaped like a gear or a starfish in plan view in conformity with the shape of the substrate.

Preferably, the IC module further comprises a covering member which is bonded to the substrate for covering the IC chip, and an elastic member interposed between the covering member and the IC chip. The IC chip is pressed against the substrate by the elastic member.

Preferably, the covering member has a recess for housing the IC chip.

Preferably, the covering member comprises a first sheet having a through-hole, and a second sheet bonded to the first sheet to close an opening of the through-hole at one end thereof.

According to a second aspect of the present invention, there is provided an IC-card comprising an IC module which includes a substrate, an IC chip mounted on the substrate, and an antenna coil electrically connected to the IC chip, the antenna coil comprising a conductive film which is patterned on a surface of the substrate, wherein the IC module is incorporated in a card member.

Preferably, the card member comprises a card body having a receiving portion for housing the IC module, and at least one cover sheet bonded to the card body to close an opening of the receiving portion.

Preferably, the IC module includes a sealing member for sealing the IC chip. The sealing member has a lower modulus of elasticity than the card body.

Preferably, the substrate comprises a flexible substrate made of a flexible resin film as a base material.

Preferably, the IC module includes a sealing member for sealing the IC chip. The IC module and the cover sheet are bonded to each other via a flexible member which is lower in modulus of elasticity than the sealing member.

Preferably, the flexible member comprises a sheet made of a thermosetting resin.

Preferably, the IC chip is located at a peripheral portion of the card member.

Preferably, the card member is rectangular, and the IC chip is located at or adjacent a corner of the card member.

Preferably, the IC chip is housed in the receiving portion of the card body with the IC chip supported by the cover sheet. A gap is formed between the IC chip and inner wall surfaces of the receiving portion.

Various features and advantages of the present invention will become clearer from the following description of embodiments given with reference to the accompanying drawings.

BRIEF DESCRIPTION OF THE DRAWINGS

FIG. 34 is a sectional view taken on line X5—X5 of FIG. 32.

FIG. 35 is an exploded sectional view of the IC-card shown in FIG. 32.

BEST MODE FOR CARRYING OUT THE INVENTION

Embodiments of the present invention will be described below with reference to the accompanying drawings.

Figure 1:
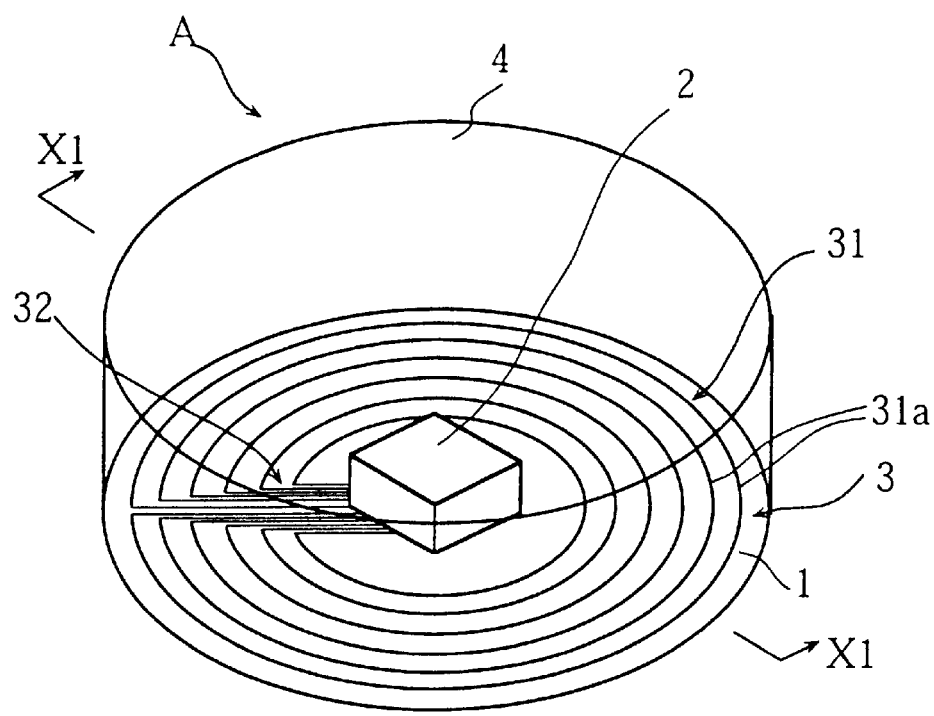
FIG. 1 is a perspective view showing an example of IC module according to the present invention.
Figure 2:
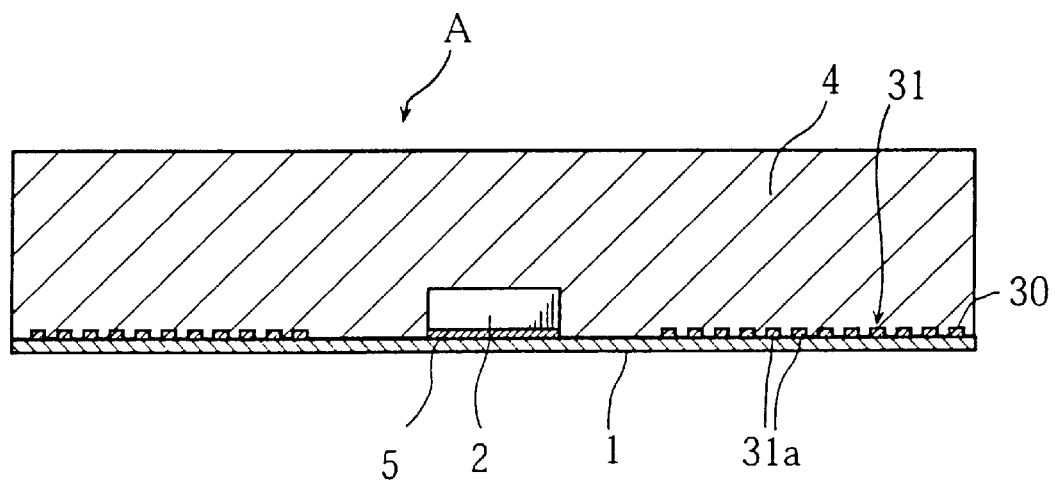
FIG. 2 is a sectional view taken along lines X1—X1 in FIG. 1.

In FIGS. 1 and 2, an IC module A of this embodiment comprises a flexible substrate 1, an IC chip 2, an antenna coil 3 and a sealing resin 4. The IC module is cylindrical as a whole.

The flexible substrate 1 comprises a thin flexible synthetic-resin film as a base material. An example of the base material is a polyimide film. The flexible substrate 1 is circular in plan view and has a thickness of about 0.1 mm for example.

Figure 3:
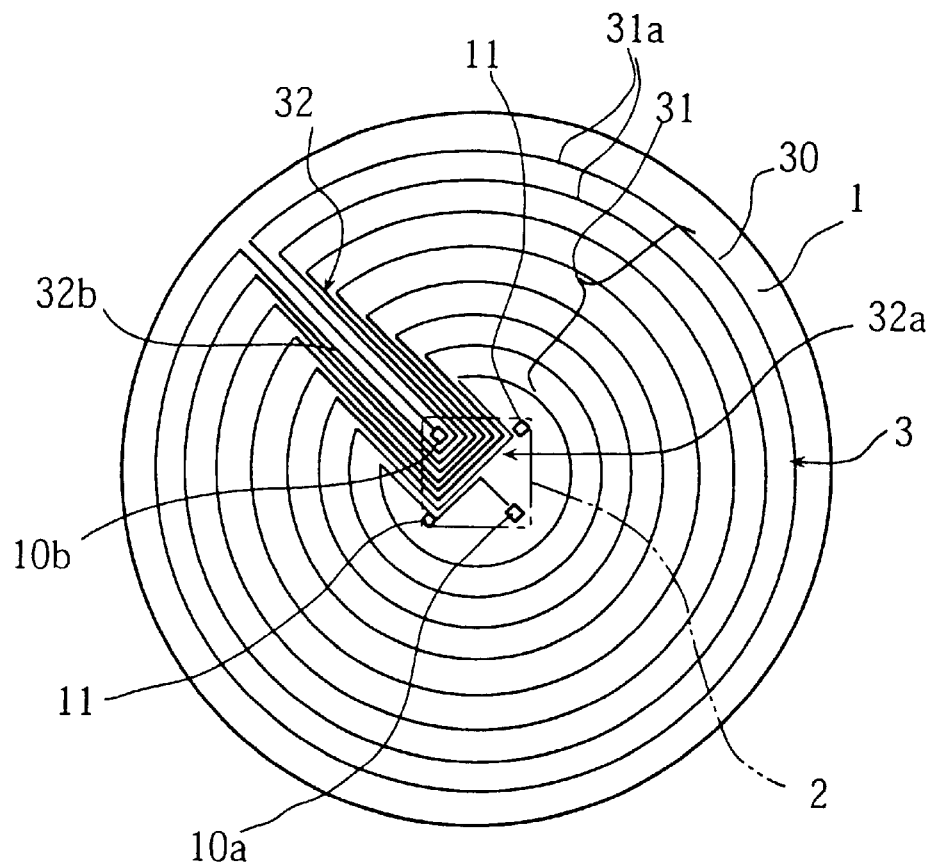
FIG. 3 is a plan view of a substrate and an antenna coil of the IC module shown in FIG. 1.

The antenna coil 3 comprises a conductive film 30 which is patterned on an obverse surface of the flexible substrate 1. The conductive film 30 is a copper foil for example. As shown in FIG. 3, the antenna coil 3 has a spiral portion 31 having a plurality of turns 31a, and a bent extension 32 extending radially inwardly of the spiral portion 31 from the plurality of turns 31a. A pair of terminals 10a, 10b are provided close to each other in the inner portion of the spiral portion 31 on the obverse surface of the flexible substrate 1 in such a manner that an inward end 32a of the bent extension 32 is placed between the terminals 10a, 10b. The pair of terminals 10a, 10b are lands protruding upward from the flexible substrate 1. The antenna coil 3 has a starting end connected to the terminal 10a. On the other hand, the bent extension 32 includes a lead 32b which provides a terminating end of the antenna coil 3. The lead 32b extends toward the terminal 10b from the outer periphery of the spiral portion 31 without contacting the plurality of turns 31a. Thus, the terminating end of the antenna coil 3 is connected to the terminal 10b while avoiding a short circuit of the antenna coil 3. The antenna coil 3 functions as a device for transmitting and receiving radio waves (electromagnetic waves) to and from a transmitter/receiver. In addition, the antenna coil 3 generates an electromagnetic force by electromagnetic induction for power supply to the IC chip 2 upon receiving radio waves.

Figure 5:
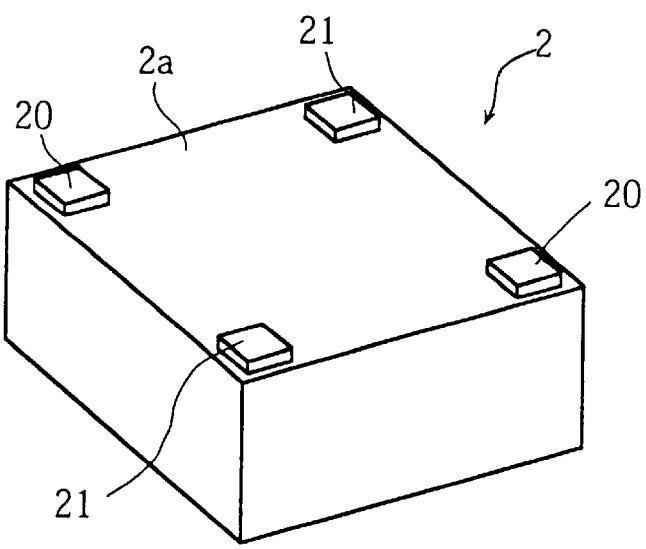
FIG. 5 is a perspective view showing an example of IC chip.

A memory such as an EEPROM, a capacitor, or the like is integrally built in the IC chip 2. The IC chip 2 is driven with the electromagnetic force inductively generated by the antenna coil 3. As better shown in FIG. 5, the IC chip 2, which has the shape of a rectangular parallelepiped, has a main surface 2a formed with a pair of electrodes 20 for connection to the antenna. The electrodes 20 on the main surface 2a are projections located at two corners on a common diagonal line. A pair of dummy electrodes 21 are also formed at the other corners on the main surface 2a. The dummy electrodes 21 are also projections which are similar to the electrodes 20. However, the dummy electrodes 21 are not connected to the internal circuitry of the IC chip 2. As better shown in FIG. 3, a pair of dummy terminals 11 corresponding to the dummy electrodes 21, 21 are provided on the upper surface of the flexible substrate 1. The dummy terminals 11 are also projections similar to the terminals 10a, 10b, but they are held out of conduction with the antenna coil 3.

Figure 4:
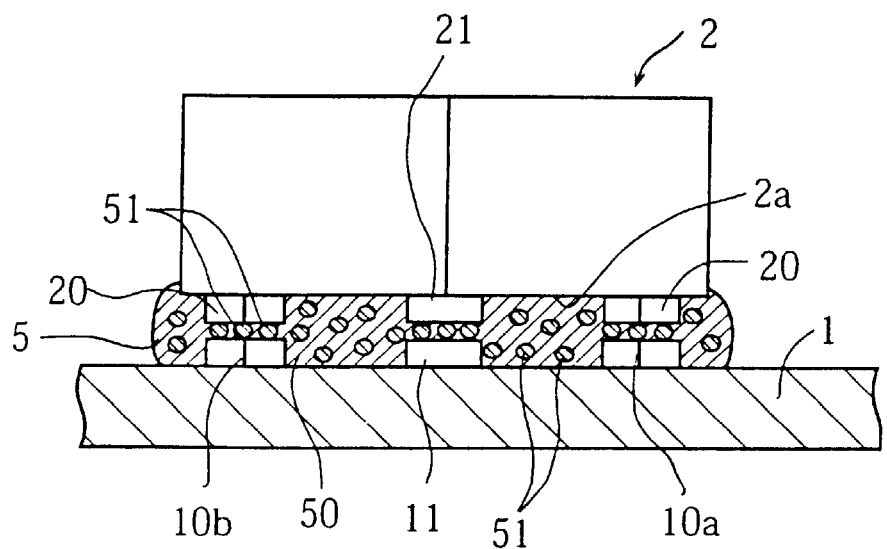
FIG. 4 is an enlarged fragmentary sectional view showing a principal portion of the IC module shown in FIG. 1.

As clearly shown in FIG. 4, the IC chip 2 is bonded to the obverse surface of the flexible substrate 1 via an anisotropic conductive film 5. The main surface 2a is directed downward with the electrodes 20 facing the terminals 10a, 10b. The dummy electrodes 21 faces the dummy terminals 11. The anisotropic conductive film 5 has conductive particles 51 such as metal particles dispersed and contained in an insulating resin 50 having adhesion. For instance, an epoxy resin may be used as the insulating resin 50. A part of the anisotropic conductive film 5 is sandwiched between each of the electrodes 20 and a respective one of the terminals 10a, 10b under a certain pressure, thereby increasing the density of the conductive particles 51 in the sandwiched part. As a result, an electrical conduction is provided only between each of the electrodes 20 and a respective one of the terminals 10a, 10b. The density of the conductive particles 51 is also increased at a portion between each of the dummy electrodes 21 and a respective one of the dummy terminals 11, but this portion has nothing to do with electrical connection between the IC chip 2 and the antenna coil 3.

As shown in FIGS. 1 and 2, the sealing resin 4 is molded to enclose the IC chip 2 and the antenna coil 3 on the obverse surface of the flexible substrate 1. The sealing resin 4 is a thin plate which is circular in plan view similarly to the flexible substrate 1. The sealing resin 4 comprises a synthetic resin whose modulus of elasticity is lower than that of a card body 7 of an IC-card B described below. An example includes an epoxy resin containing no strength-increasing filler. The sealing resin 4 covers only the obverse surface of the flexible substrate 1. However, the present invention is not limited to such a structure. Apart of the sealing resin may extend to the reverse surface of the flexible substrate 1 for example.

In manufacturing an IC module A, an antenna coil 3 may be formed by first depositing a copper foil substantially over the entire obverse surface of the flexible substrate 1 by vapor deposition, sputtering or CVD, and then etching the copper foil. A pair of terminals 10a, 10b and A pair of dummy terminals 11 can be also formed at the time of forming the antenna coil 3. After the formation of the antenna coil 3, an anisotropic conductive film 5 is applied onto the flexible substrate 1, and an IC chip 2 is pressed against the pair of terminals 10a, 10b. Such a series of process steps permits the fabrication of the antenna coil 3 while establishing electrical conduction between the antenna coil 3 and the IC chip 2, thereby considerably increasing the production efficiency.

The electrodes 20 and the dummy electrodes 21 face the pair of terminals 10a, 10b and the pair of dummy terminals 11, respectively, whereby the IC chip 2 is supported at four points. This prevents the IC chip 2 from being inclined. Therefore, the IC chip 2 can be stably mounted on the flexible substrate 1. Further, it is possible to automate mounting of the IC chip 2 on the flexible substrate 1 with the use of an existing chip mounting apparatus.

Since the antenna coil 3 is provided by the patterned conductive film 30, its thickness can be rendered smaller than that of the IC chip 2. Even when the number of turns 31a of the spiral 31 is considerably increased, the antenna coil 3 will not become bulky. Accordingly, the thickness of the whole IC module A may be also reduced to about 0.45 mm for example. Further, the location of the IC chip 2 inward of the spiral 31 of the antenna coil 3 provides a good space efficiency. Therefore, the outer diameter of the whole IC module A can be also reduced.

Since the paired electrodes 20 are located at the corners on a common diagonal line on the main surface 2a of the IC chip 2, the distance between the paired electrodes 20 is maximum within the area of the main surface 2a. Thus, the distance between the paired terminals 10a, 10b can be relatively increased, thereby making it possible to increase the width of the bent extension 32 between the paired terminals 10a, 10b. Therefore, the number of turns 31a can be correspondingly increased to enhance the properties of the antenna coil 3. Since the IC chip 2 and the antenna coil 3 are protected by the sealing resin 4, the IC module A can be handled without damaging these components.

Next, reference is made to FIGS. 6 through 8a for explaining an IC-card B which incorporates the above-described IC module A.

Figure 6:
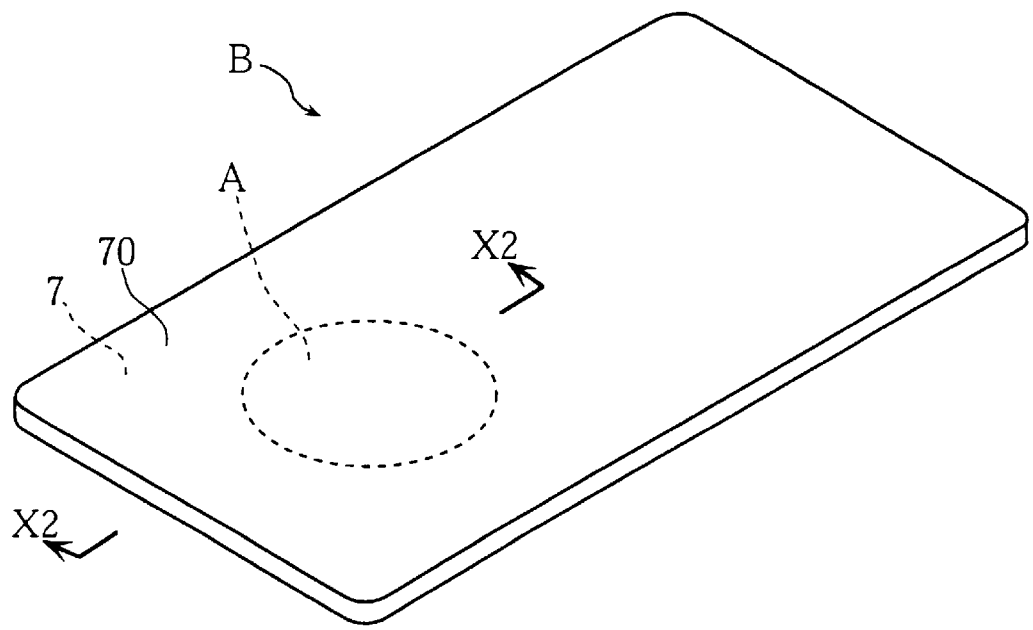
FIG. 6 is a perspective view showing an example of IC-card according to the present invention.

Referring to FIG. 6, the IC-card B is rectangular in plan view and has a thickness of about 0.76 mm for example. As clearly shown in FIG. 8, the IC-card B comprises a card body 7 and two cover sheets 70, 71 in addition to the IC module A.

The card body 7 is made of a synthetic resin such as polyethylene terephthalate resin (hereinafter abbreviated as PET) or polyvinyl chloride (hereinafter abbreviated as PVC). Unlike the sealing resin 4, the synthetic resin for the card body 7 contains a filler as a reinforcing material. Thus, the modulus of elasticity of the card body 7 is no less than 9.8 GPa for example. By contrast, the modulus of elasticity of the sealing resin 4 is no more than 9.0 GPa for example and therefore lower than that of the card body 7. The card body 7 has a thickness of about 0.45 mm similarly to the IC module A. The card body 7 has a receiving portion 72 in the form of a through-hole for housing the IC module A.

The two cover sheets 70, 71 are shaped to conform to the card body 7 in plan view, and have a respective thickness of about 0.15 mm for example. The cover sheets 70, 71 are also made of a synthetic resin such as PET or PVC similarly to the card body 7. The cover sheets 70, 71 are bonded to the obverse and reverse surfaces, respectively, of the card body 7 after the IC module A is housed in the receiving portion 72. Therefore, the receiving portion 72 are upwardly and downwardly closed by the respective cover sheets 70, 71, thereby enclosing the IC module A in the receiving portion 72. The above-described overall thickness of the IC-card includes the thickness of an adhesive layer for bonding each of the cover sheets 70, 71 to the card body 7.

Figure 8:
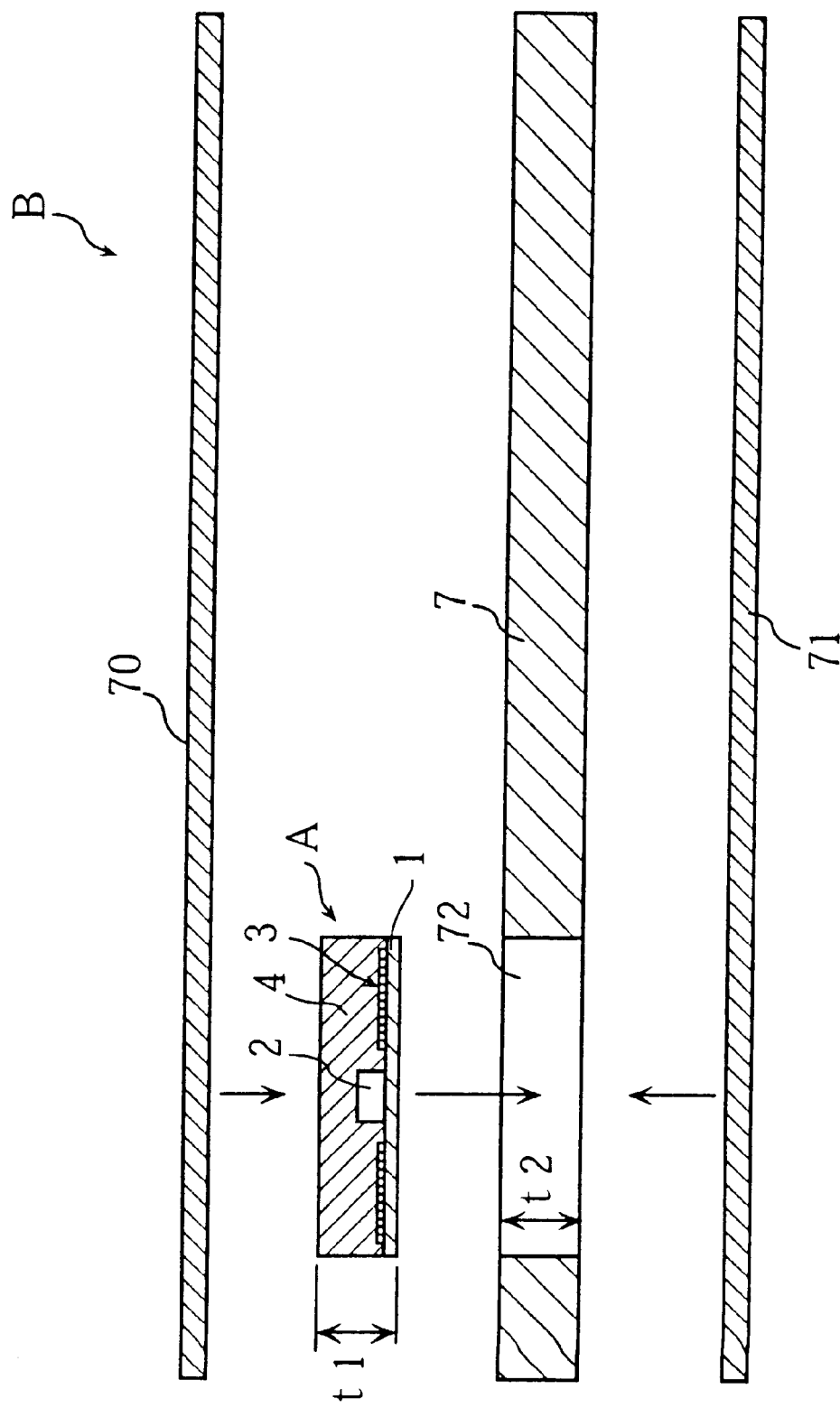
FIG. 8 is an exploded sectional view of the IC-card shown in FIG. 6.

As clearly shown in FIG. 8, even if the thickness t1 of the IC module A in the IC-card B is slightly greater than the depth of the receiving portion 72 (i.e., the thickness t2 of the card body 7), the IC module A can be appropriately housed in the receiving portion 72. When the IC module A fitted in the receiving portion 72 has a thickness greater than the depth of the receiving portion 72, the IC module A partially projects out from the receiving portion 72. However, due to the low modulus of elasticity of the sealing resin 4, the IC module A may be easily compressed in its thickness direction by the cover sheets 70, 71 which are bonded to the card body 7, thereby reducing the thickness of the IC module A to be equal to the depth of the receiving portion 72. As a result, the IC module A can be appropriately encapsulated in the receiving portion 72. In this manner, the cover sheets 70, 71 bonded tightly to both surfaces of the IC module A prevents the IC module A from being inappropriately displaced in the receiving portion 72. The manufacture of the IC module A and the card body 7 is facilitated because the thickness of the IC module A does not need to exactly coincide with the depth of the receiving portion 72.

Figure 7:
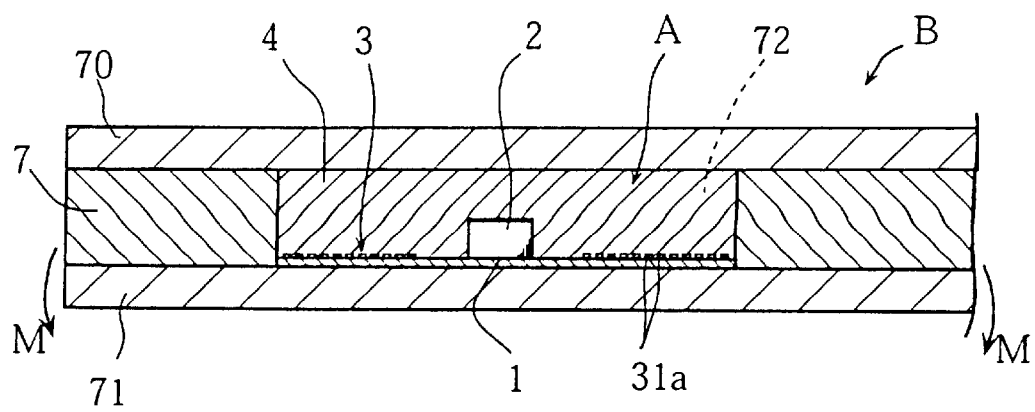
FIG. 7 is a sectional view taken along lines X2—X2 in FIG. 6.

The IC-card B is thin and flat to provide flexibility. Thus, a bending stress M may be exerted near the IC module A when the IC-card B is wholly or partially bent, as shown in FIG. 7. In this case, the sealing resin 4 of the IC module A is deformed in the same manner as the card body 7 following the bending deformation of the card body 7 because the modulus of elasticity of the sealing resin 4 is lower than that of the card body 7. Though such a bending deformation of the sealing resin 4 generates a strain at the boundary between the sealing resin 4 and the IC chip 2. However, since the low modulus of elasticity of the sealing resin 4 is low, it is possible to reduce the stress resulting from the strain of the sealing resin 4. Therefore, the IC chip 2 is prevented from significantly damaged even if a bending force is applied to the IC-card B. As a result, it is possible to prevent a loss of the data stored in the IC chip 2 which might occur due to a damage of the IC chip 2.

Figure 9:
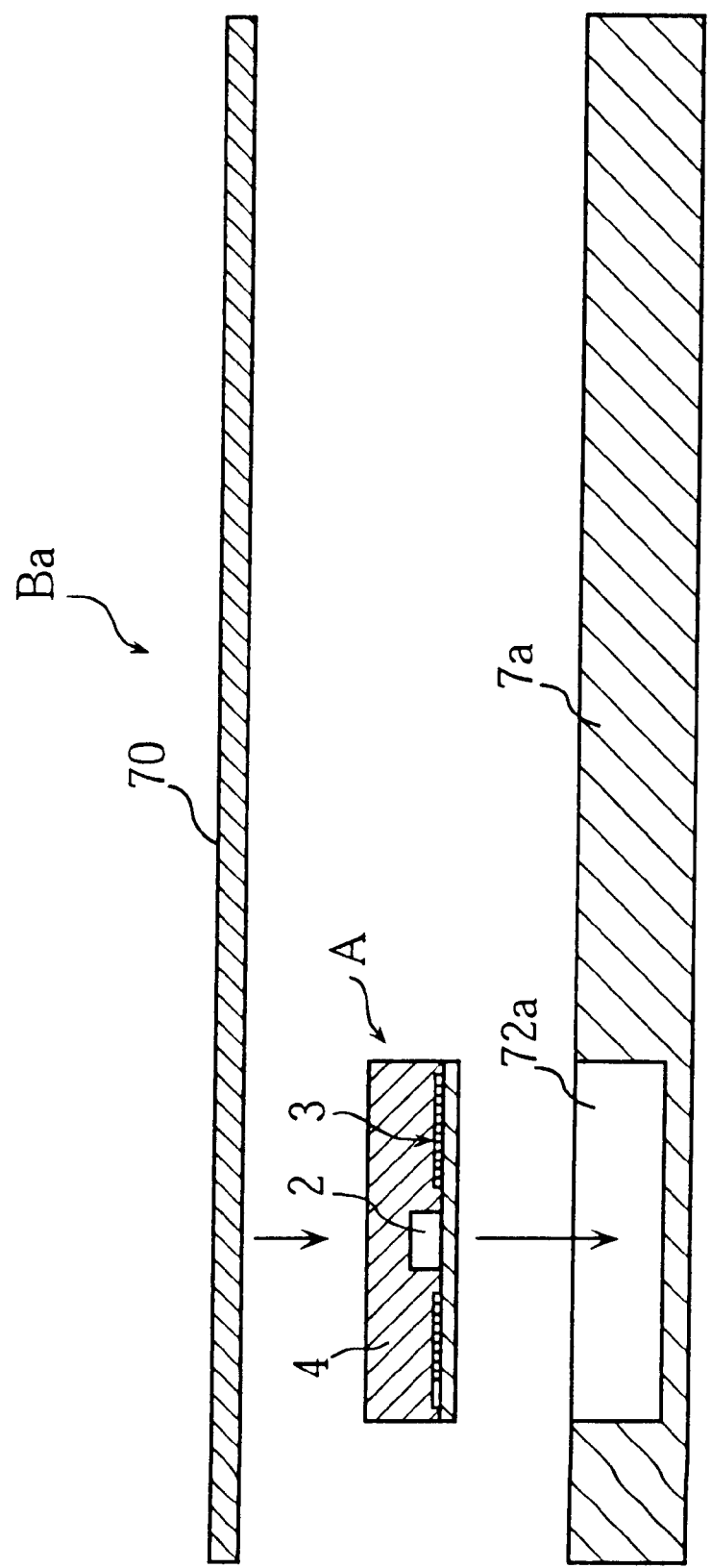
FIG. 9 is an exploded sectional view showing another example of IC-card according to the present invention.

Next, other embodiments of the present invention will be described with reference to FIGS. 9 through 40. In FIG. 9 and the subsequent figures, identical or similar elements are denoted by the same reference signs as those of the foregoing embodiment.

An IC-card Ba shown in FIG. 9 includes a receiving portion 72a in the form of a bottomed recess formed in a card body 7a. The receiving portion 72a houses an IC module A. According to this structure, only a single cover sheet 70 need be bonded to the card body 7a, thereby reducing the number of the components required for the IC-card.

Figure 10:
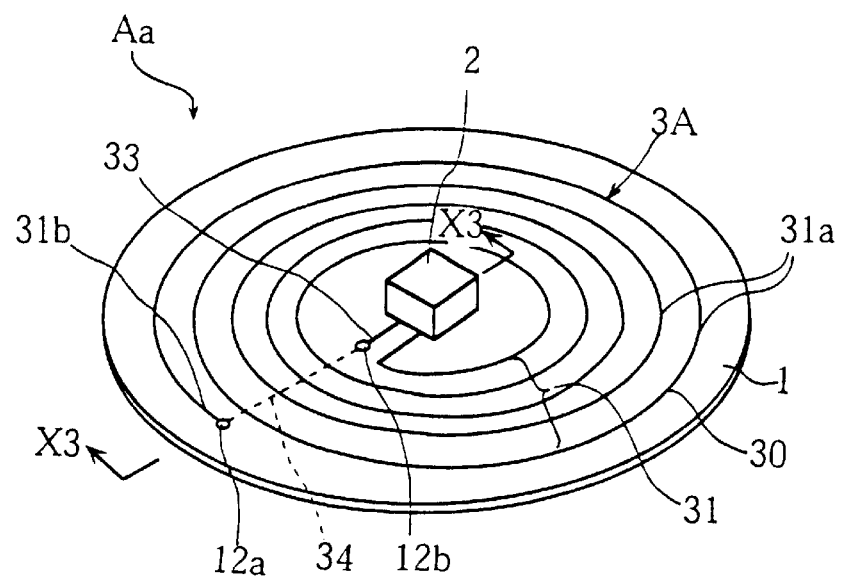
FIG. 10 is a perspective view showing a substrate and an antenna coil in another example of IC module according to the present invention.
Figure 11:
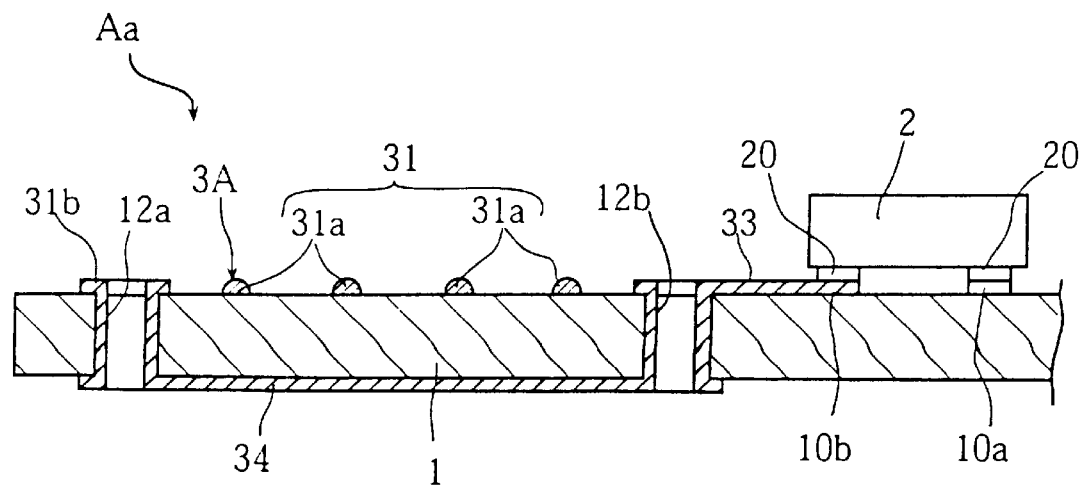
FIG. 11 is a sectional view taken along lines X3—X3 in FIG. 10.

An IC module Aa shown in FIGS. 10 and 11 includes an antenna coil 3A which structurally differs from the antenna coil 3. The antenna coil 3A has a spiral portion 31 formed on the obverse surface of the flexible substrate 1, as is also the case with the antenna coil 3. However, the antenna coil 3A includes a lead 33 formed on the obverse surface of the flexible substrate 1 in connection to a terminal 10b, and a lead 34 formed on the reverse surface of the flexible substrate 1. The flexible substrate 1 is provided with a pair of through-holes 12a and 12b at positions inwardly and outwardly, respectively, of the spiral portion 31. A terminating end 31b of the spiral portion 31 conducts to one end of the lead 34 via the through-hole 12a. The other end of the lead 34 is connected to the lead 33 via the through-hole 12b.

In the IC module Aa, the starting and terminating ends of the antenna coil 3A can be also located at an inner position of the spiral portion 31 without short-circuiting of the antenna coil 3A, thereby providing the same advantages as the IC module A. In this way, the antenna coil may be formed by utilizing both of the obverse and reverse surfaces of the flexible substrate 1 according to the present invention.

Figure 12:
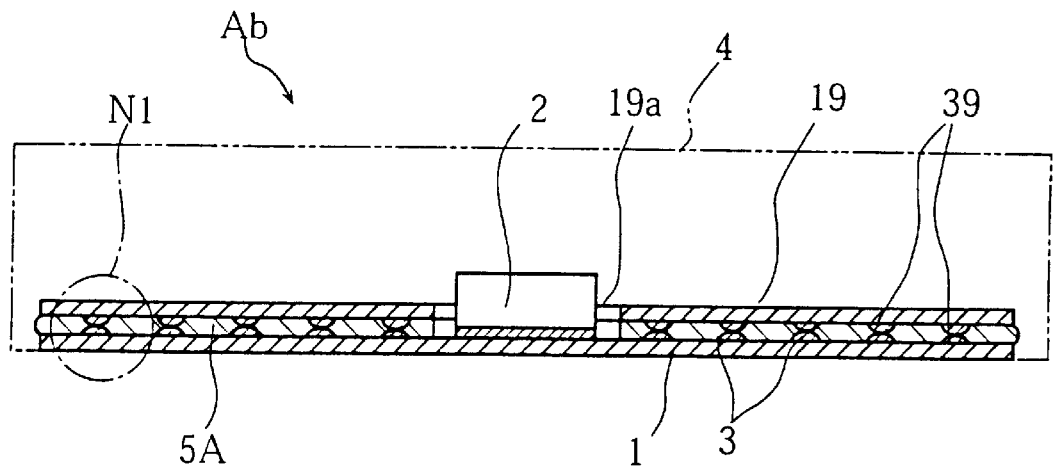
FIG. 12 is a sectional view showing another example of IC module according to the present invention.
Figure 13:
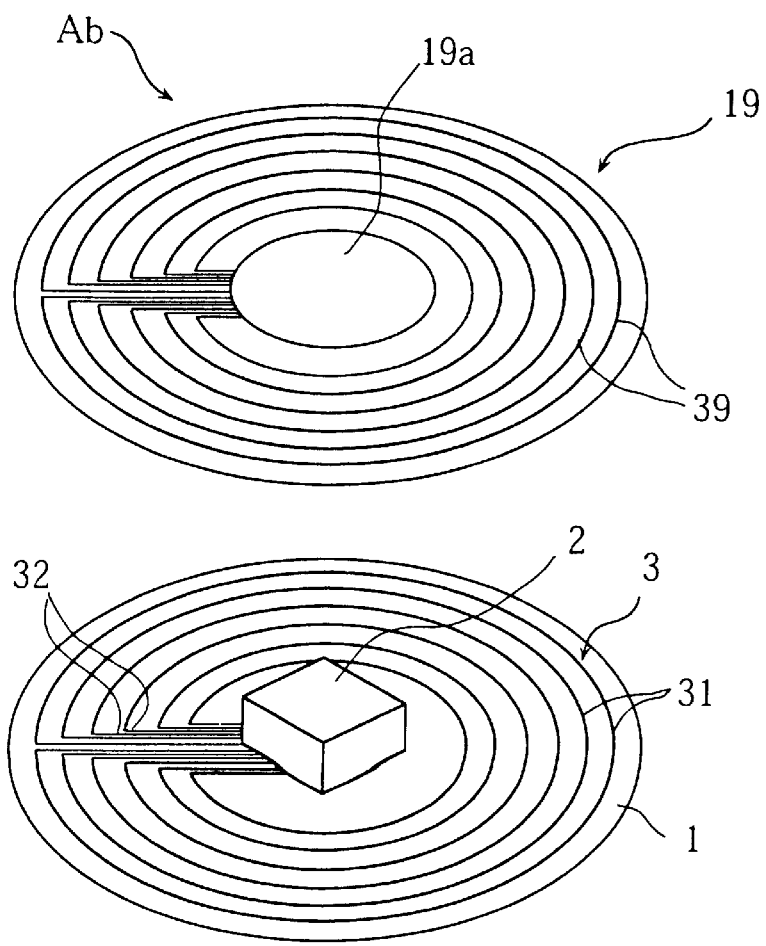
FIG. 13 is an exploded perspective view showing principal components of the IC module shown in FIG. 12.
Figure 14:
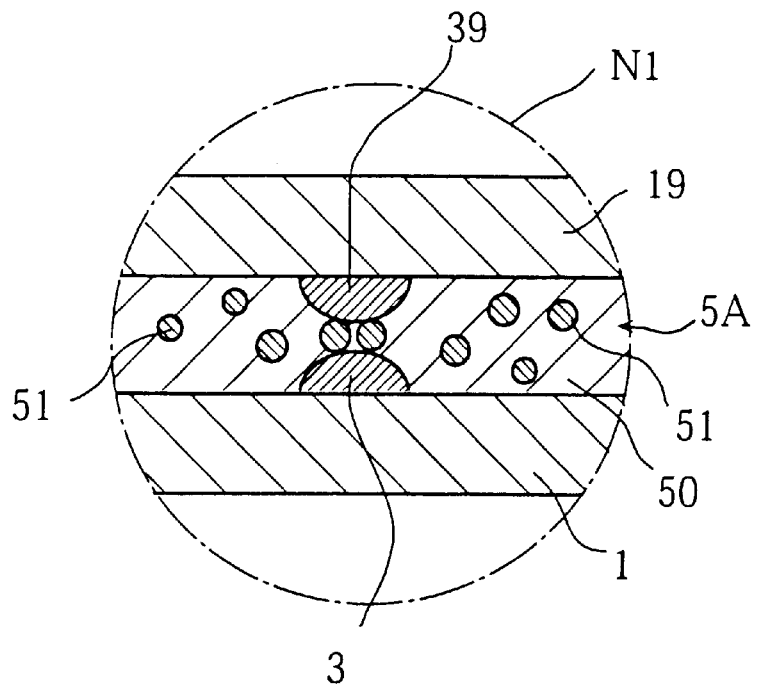
FIG. 14 is an enlarged view showing the portion encircled at N1 in FIG. 12.

An IC module Ab shown in FIG. 12 includes a film 19 separate from a flexible substrate 1 which carries an IC chip 2 at the center thereof. Similarly to the flexible substrate 1, the film 19 may be made of polyimide for example. The film is centrally formed with a hole 19a which is larger in size than the IC chip 2. As better shown in FIG. 13, a conductor pattern 39 is formed on one surface of the film 19. The conductor pattern 39 is symmetrical or substantially symmetrical to the antenna coil 3 on the obverse surface of the flexible substrate 1. As shown in FIG. 12, the film 19 is laid on and bonded to the obverse surface of the flexible substrate 1, so that the pattern of the antenna coil 3 and the conductor pattern 39 face each other. The IC chip 2 protrudes upward through the hole 19a. The flexible substrate 1 and the film material 19 are bonded to each other via an anisotropic conductive film 5A which is similar in property to the anisotropic conductive film 5. As shown in FIG. 14, the pattern of the antenna coil 3 and the conductor pattern 39 conduct to each other through the conductive particles 51 of the anisotropic conductive film 5A.

In the IC module Ab, the thickness of the antenna coil 3 is virtually increased by as much as the sum of the size of the conductive particles 51 and the thickness of the conductor pattern 39. Thus, the inherent characteristics of the antenna coil 3 can be greatly improved as in the case of an antenna coil made of a relatively thick metal wire. There is a limitation on increasing the thickness of a conductor film 30 for the antenna coil 3 if it is formed on the obverse surface of the flexible substrate 1 only by sputtering, vapor deposition or CVD. In particular, as the pattern is more sophisticated, it becomes more difficult to increase the thickness of the conductive film 30, resulting in an increasing loss of the intended antenna function. Such a problem is appropriately eliminated in the IC module Ab. Of course, the IC module Ab may also have a structure in which the IC chip 2 is enclosed in a sealing resin 4. The IC chip 2 is exposed above the film 19 through the hole 19a, whereby the IC chip 2 can be appropriately sealed by the sealing resin 4 when the upper surface of the film 19 is covered with the sealing resin 4.

Figure 15:
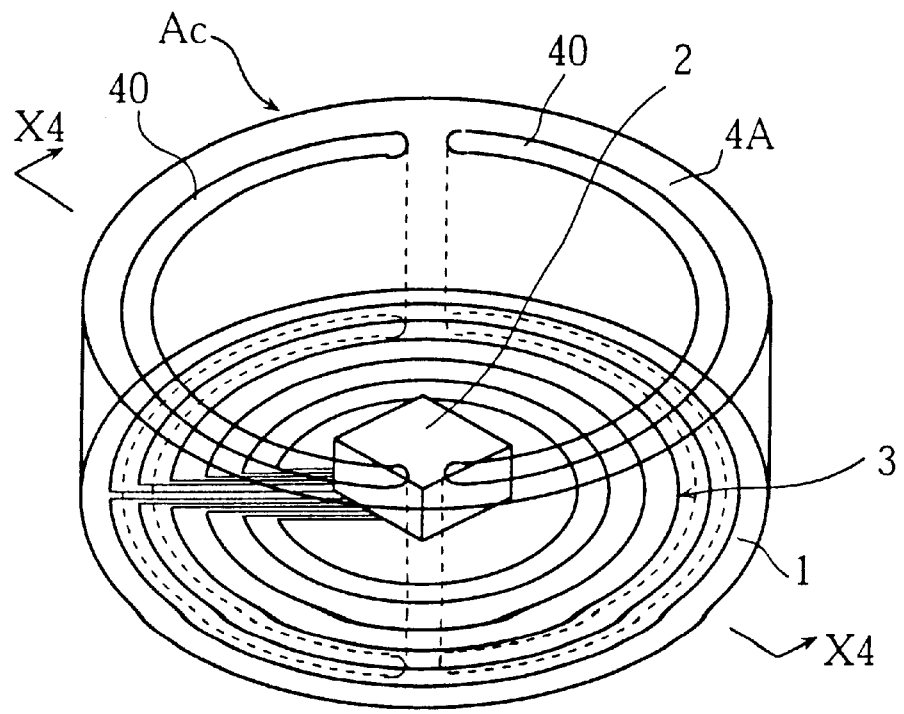
FIG. 15 is a perspective view showing a further example of IC module according to the present invention.
Figure 16:
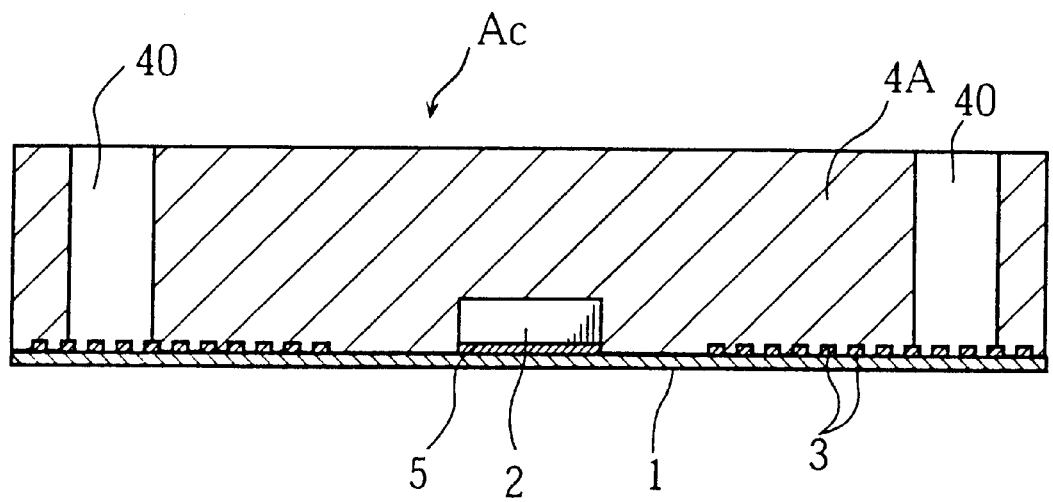
FIG. 16 is a sectional view taken along lines X4—X4 in FIG. 15.
Figure 17:
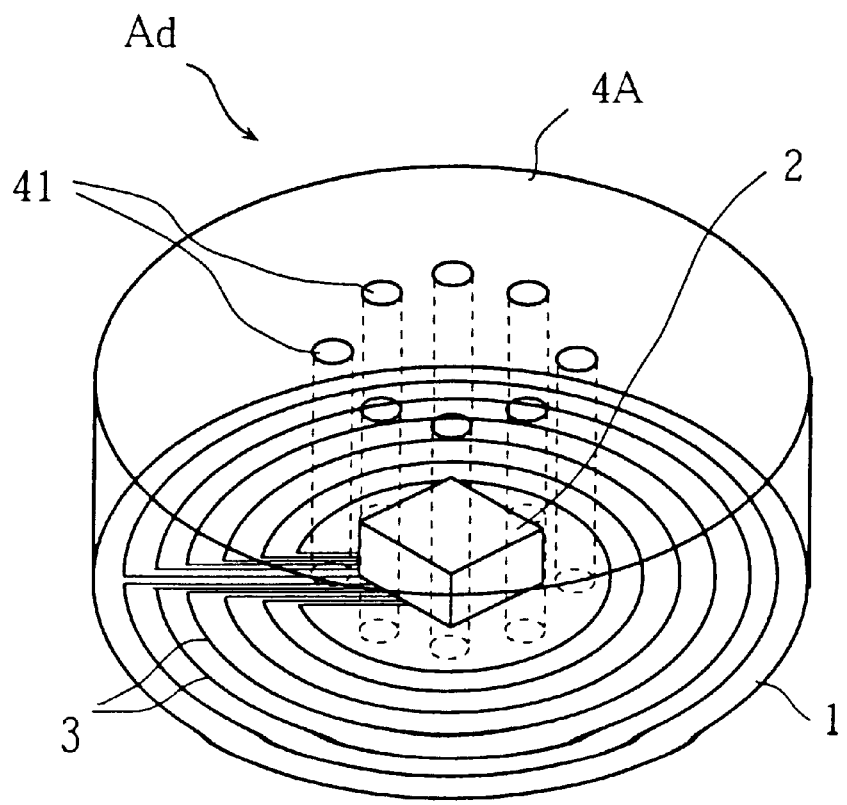
FIG. 17 is a perspective view showing a further example of IC module according to the present invention.

FIGS. 15 and 16 illustrates an IC module Ac which comprises a sealing resin 4A for enclosing an IC chip 2 and an antenna coil 3, and the sealing resin 4A has a plurality of perforations 40 as weakening portions. Each of the plural perforations 40 penetrates through the sealing resin 4A in the thickness direction of the sealing resin 4A. The perforations 40 are arcuate in plan view to surround the IC chip 2. The perforations 40 maybe formed at the time of molding the sealing resin 4A.

When a bending stress is applied to the IC module Ac, the stress is concentrated at the perforations 40 to prevent the IC chip 2 from being intensively stressed. More specifically, when the IC module Ac is flexed, the width of each perforation 40 is increased or reduced. Such a deformation buffers the stress generated in the sealing resin 4A, thereby reducing the stress applied to the IC chip 2. It is therefore possible to prevent the IC chip 2 from being significantly damaged even if the IC-card incorporating the IC module Ac is flexed in use.

The weakening portions formed in the sealing resin 4A may be variously modified in design. An IC module Ad shown in FIG. 17 includes a sealing resin 4A having a plurality of cylindrical perforations 41 which penetrate through the sealing resin 4A in the thickness direction thereof. The perforations 41 are arranged in such an arrangement as to surround the IC chip 2 in plan view. As is the case with the IC module Ac, such a design also reduces the stress applied to the sealing resin 4A by the deformation of the perforations 41, thereby preventing the IC chip 2 from being subjected to a large stress. The weakening portions in the sealing resin may be provided by pin holes which are diametrically smaller than the perforations 41.

Figure 18:
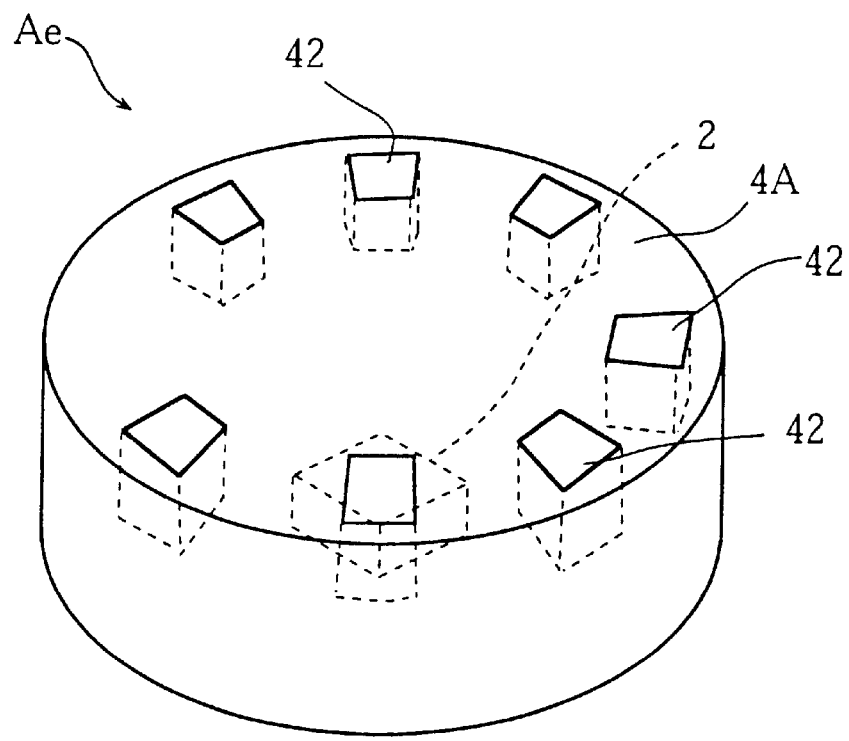
FIG. 18 is a perspective view showing a further example of IC module according to the present invention.
Figure 19:
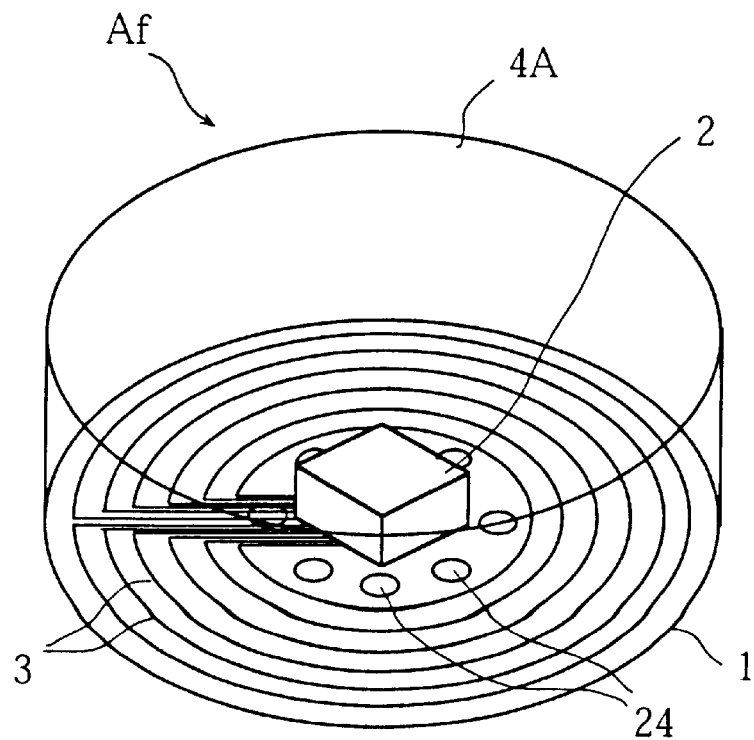
FIG. 19 is a perspective view showing a further example of IC module according to the present invention.

An IC module Ae shown in FIG. 18 includes a sealing resin 4A having an obverse surface formed with a plurality of bottomed recesses 42 of a suitable depth as weakening portions. The recesses may be variously shaped. According to the present invention, in this way, suitably shaped recesses formed in the obverse surface of the sealing resin may provide weakening portions, and the number of such weakening portions may be optionally selected.

According to the present invention, a substrate for carrying an IC chip may be provided with weakening portions. For example, an IC module Af shown in FIG. 19 has a flexible substrate 1 which is formed with a plurality of perforations 24 around the IC chip 2 as weakening portions. The perforations 24 may be formed by etching the flexible substrate 1 after forming the pattern of the antenna coil 3 on the obverse surface of the flexible substrate 1. Alternatively, the perforations 24 may be formed in the flexible substrate 1 in advance by pressing, and then the pattern of the antenna coil 3 may be formed on the obverse surface of the flexible substrate 1 to circumvent the perforations 24.

When a bending stress is applied to the IC module Af, the stress is concentrated at the perforations 24 of the flexible substrate 1, so that the stress is not intensively applied to the IC chip 2. The weakening portions may be formed either in the sealing resin or the substrate for preventing intensive application of a stress to the IC chip. Preferably, the weakening portions may be formed in both of the sealing resin 4A and the flexible substrate 1.

Figure 20:
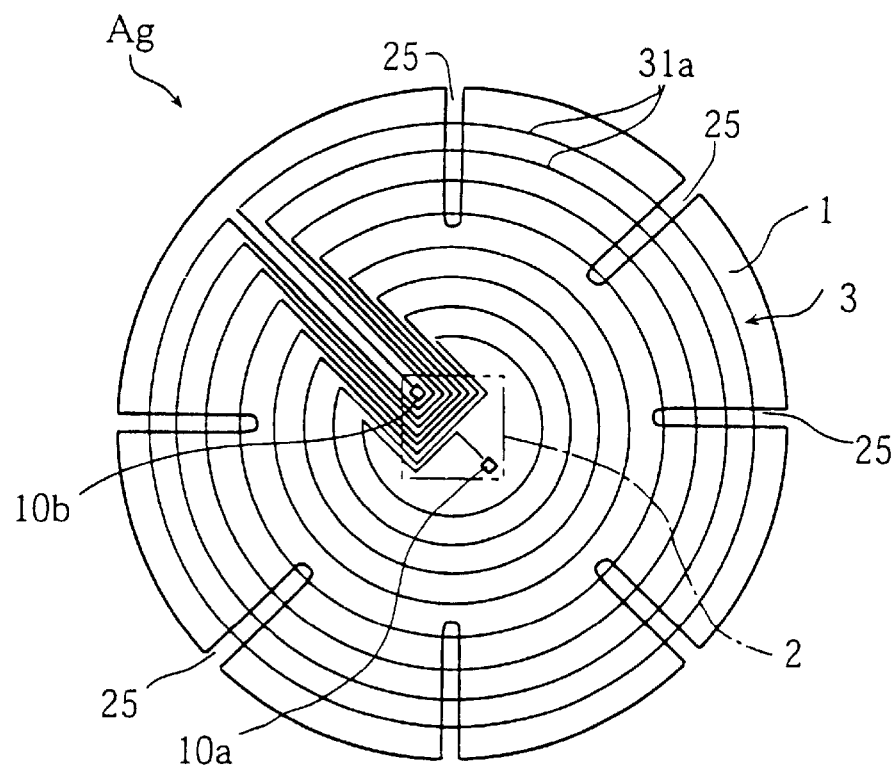
FIG. 20 is a plan view showing a further example of IC module according to the present invention.

An IC module Ag shown in FIG. 20 comprises a flexible substrate 1 which is provided with a plurality of radial slits 25 extending inward from the peripheral edge of the flexible substrate 1. The IC chip 2 is mounted at the center of the flexible substrate 1 inwardly from the slits 25. The slits 25 may be formed by etching the flexible substrate 1 after forming the pattern of an antenna coil 3 on the flexible substrate 1.

Though not illustrated, the IC module Ag also includes a sealing resin package made of e.g. a thermosetting epoxy resin for enclosing the IC chip 2 and the antenna coil 3. The sealing process maybe performed by supplying a sealing resin fluidized at high temperature into a mold, and then allowing the sealing resin to harden under heating. With a temperature drop after the molding process, the sealing resin shrinks while it remains bonded to the flexible substrate 1. On the other hand, the flexible substrate 1 made of e.g. polyimide differs in linear expansion coefficient from the sealing resin. Normally, the shrinkage of the sealing resin causes the flexible substrate 1 to be considerably warped due to a difference in shrinkage between the flexible substrate and the sealing resin, so that a stress resulting from the warping may be applied to the IC chip 2. However, the flexible substrate 1 of the IC module Ag can deform to reduce the width of the slits 25 when the sealing resin shrinks, so that the width reduction of the slits 25 takes the place of the shrinkage of the flexible substrate 1 as a whole. Therefore, at least the center of the flexible substrate 1 is prevented from warping to a large extent, thereby protecting the IC chip 2.

Figure 21:
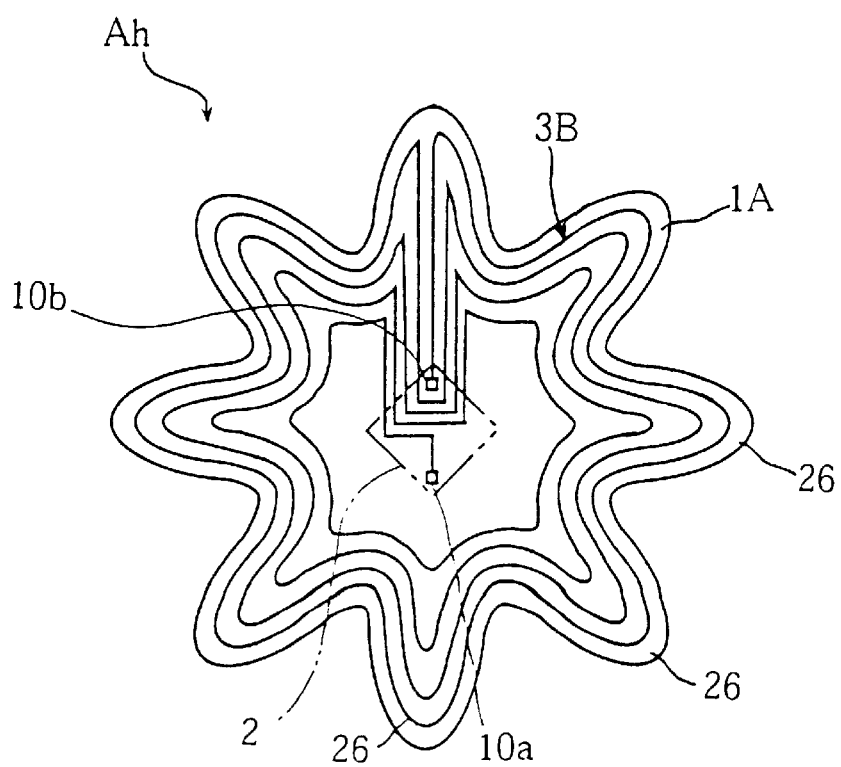
FIG. 21 is a plan view showing a further example of IC module according to the present invention.

An IC module Ah shown in FIG. 21 comprises a flexible substrate 1A having radially extending projections 26 centered about a portion on which an IC chip 2 is mounted. Thus, the flexible substrate 1A as a whole is shaped like a gear or a starfish in plan view. In this IC module Ah, the spacing between the projections 26 reduces with a shrinkage of a sealing resin occurring due to a temperature drop after molding the sealing resin in intimate bonding contact with the obverse surface of the flexible substrate 1A to enclose the IC chip 2 and an antenna coil 3B. Therefore, the flexible substrate 1A is prevented from being greatly warped, thereby protecting the IC chip 2, as in the case of the IC module Ag.

In the IC module Ah, the pattern of an antenna coil 3B is also shaped like a gear or a starfish in plan view in conformity with the shape of the flexible substrate 1A. Due to such a configuration, since the pattern of the antenna coil 3B extends radially on the projections 26 of the flexible substrate 1A, the pattern of the antenna coil 3B on the projections 26 does not hinder shrinkage of the sealing resin 4. Thus, the flexible substrate 1A is prevented from inappropriately deforming due to a shrinkage hindrance provided by the antenna coil 3B.

In the IC module Ah, the sealing resin for sealing the IC chip 2 and the antenna coil 3B is also shaped like a gear or a starfish in plan view to have a plurality of projections in conformity with the shape of the flexible substrate 1A. According to such a structure, the sealing resin shrinks with a reduction of the spacing between the projections of the sealing resin. Thus, the warping of the flexible substrate 1A in its thickness direction is correspondingly reduced, so that the IC chip 2 is protected against damage even more reliably. According to the above-described structure, even if an IC-card incorporating the IC module Ah is bent, the projections 26 of the flexible substrate 1A and the corresponding projections of the sealing resin are locally flexed to allow for the bending of the IC-card. Therefore, it is possible to avoid stress concentration on the IC chip 2 for protection thereof.

Figure 22:
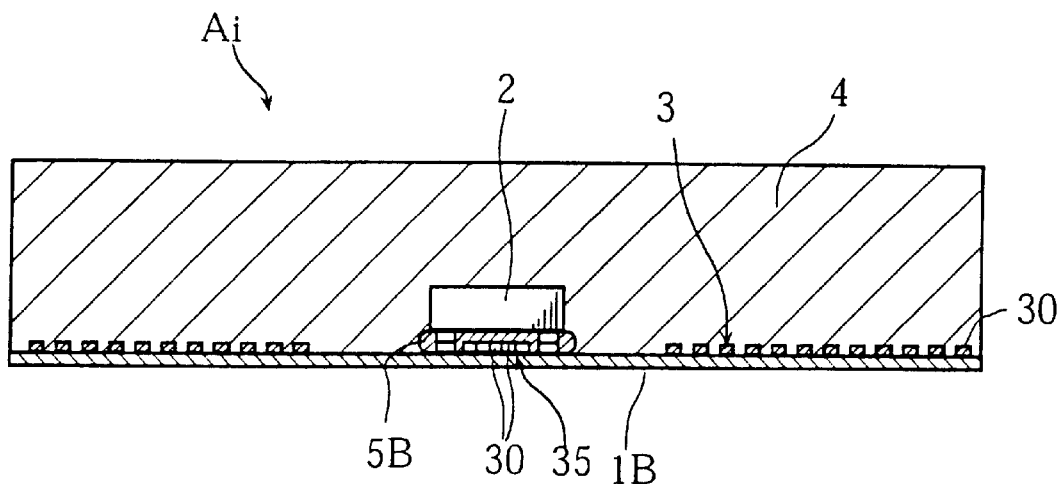
FIG. 22 is a sectional view showing a further example of IC module according to the present invention.
Figure 23:
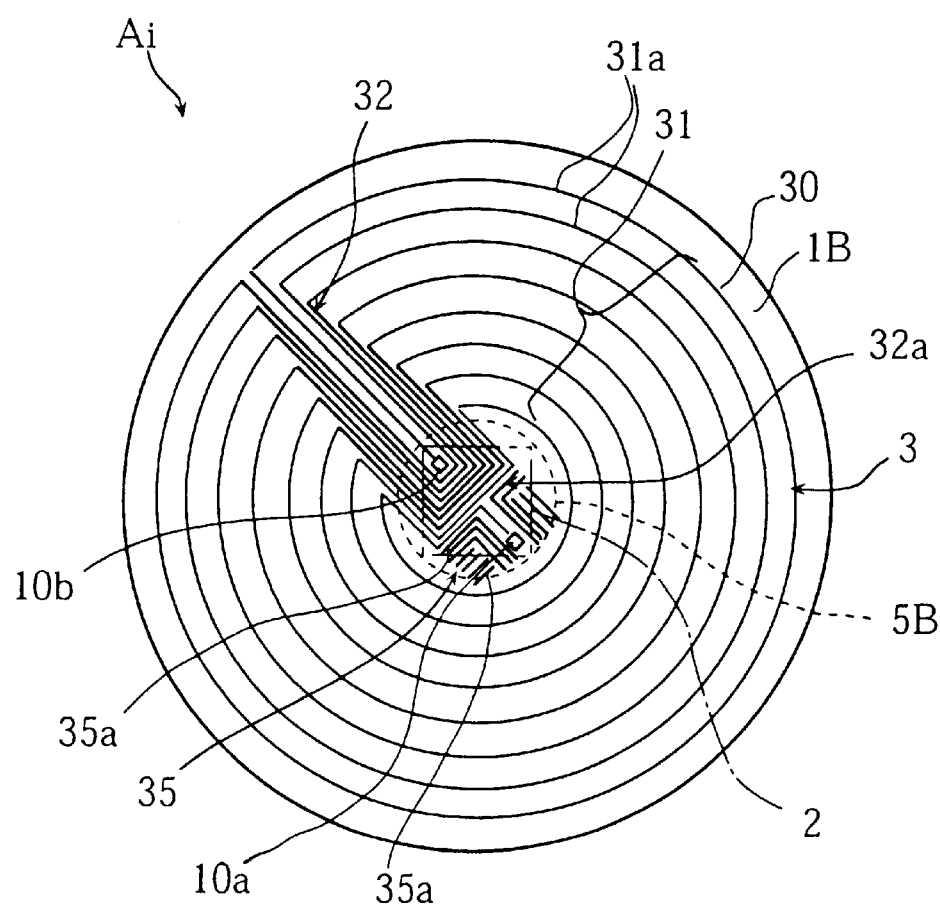
FIG. 23 is a plan view showing a substrate and an antenna coil of the IC module shown in FIG. 22.
Figure 24:
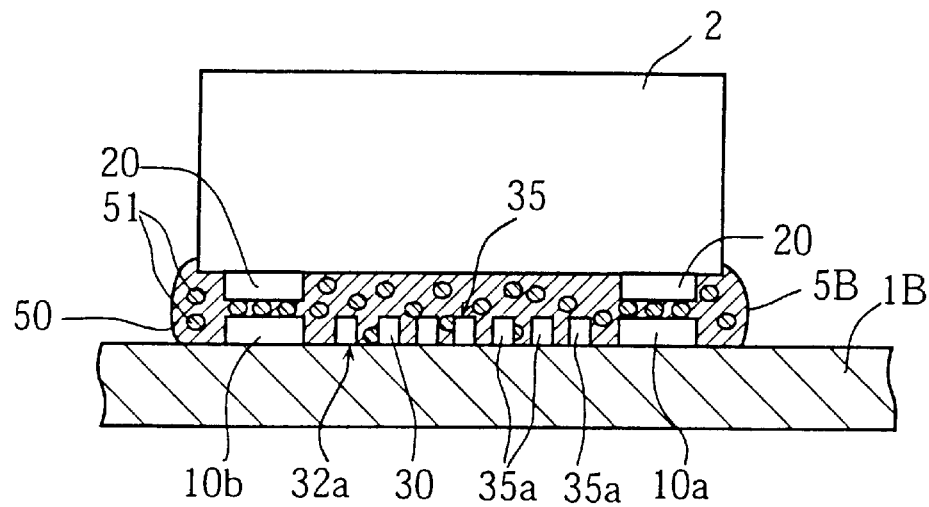
FIG. 24 is a partially enlarged sectional view of the IC module shown in FIG. 22.

An IC module Ai shown in FIG. 22 has a flexible substrate 1B whose material is PET. As shown in FIGS. 23 and 24, a bond assisting layer 35 is formed at a portion of the flexible substrate 1B on which an adhesive layer 5B is applied for bonding the IC chip 2 to the flexible substrate 1B. The bond assisting layer 35 comprises an inner end 32a of the bent extension 32 of the antenna coil 3 and a dummy pattern 35a formed near the inner end 32a. The dummy pattern 35a may be provided by the conductive film 30 which is patterned on the obverse surface of the flexible substrate 1B to have a plurality of stripe lines at the time of patterning the antenna coil 3. Thus, the dummy pattern 35a may be made of the same material, such as copper, as the antenna coil 3. The adhesive layer 5B may be made of an anisotropic conductive film for example, like the anisotropic conductive film 5.

The use of the PET flexible substrate 1B is advantageous for its lower cost in comparison with a polyimide flexible substrate. On the other hand, the use of the PET flexible substrate 1B normally results in lower adhesion between the flexible substrate 1B and the adhesive layer 5B. Since the adhesive layer 5B firmly adheres to an object by means of molecular hydrogen bonding, it cannot provide a sufficient adhesion if the object is made of PET having no molecular part which induces such hydrogen bonding. In the IC module Ai, however, the adhesive layer 5B also adheres to the surfaces of the bond assisting layer 35. Since the bond assisting layer 35 is made of copper, the adhesive layer 5B firmly adheres to the bond assisting layer 35. It is therefore possible to improve the adhesion of the bond assisting layer 35 to the obverse surface of the flexible substrate 1B. In particular, since the dummy pattern 35a increases the surface area of the bond assisting layer 35, it further enhances the adhesion between the flexible substrate 1B and the bond assisting layer 35. As a result, the IC chip 2 can be reliably held on the flexible substrate 1B. Further, since the dummy pattern 35a may be formed together with the pattern of the antenna coil 3, it does not complicates the manufacturing process of the IC module Ai.

Figure 25:
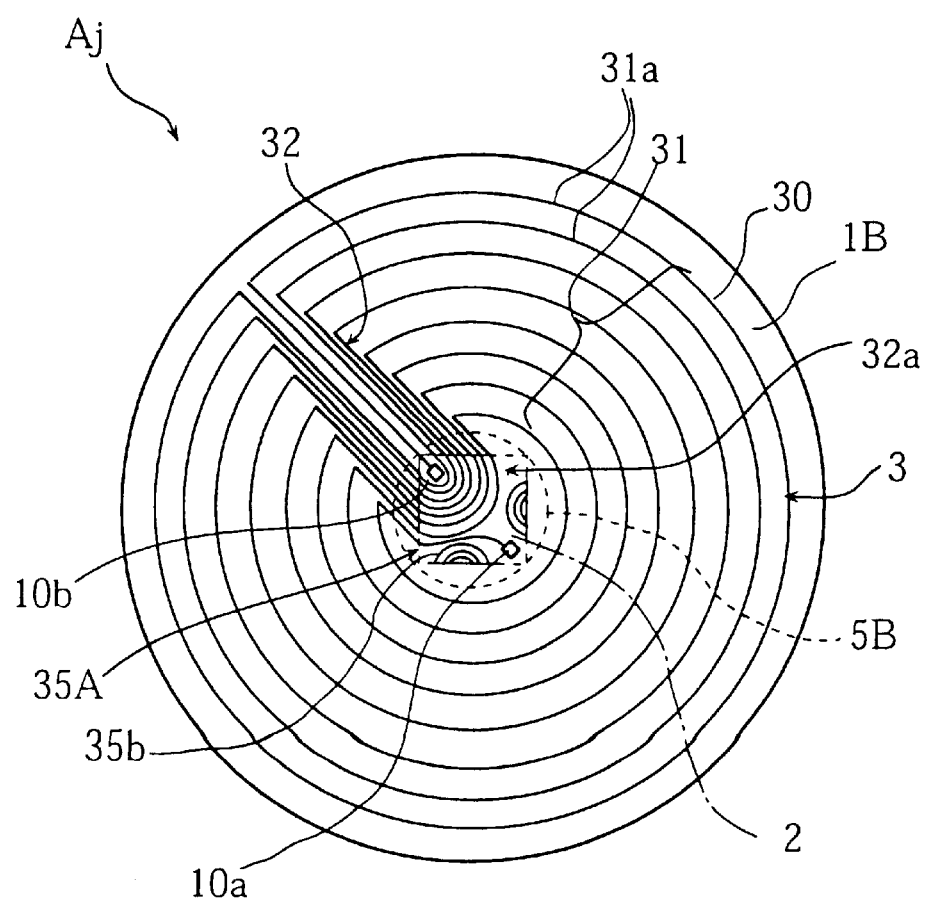
FIG. 25 is a plan view showing a further example of IC module according to the present invention.
Figure 26:
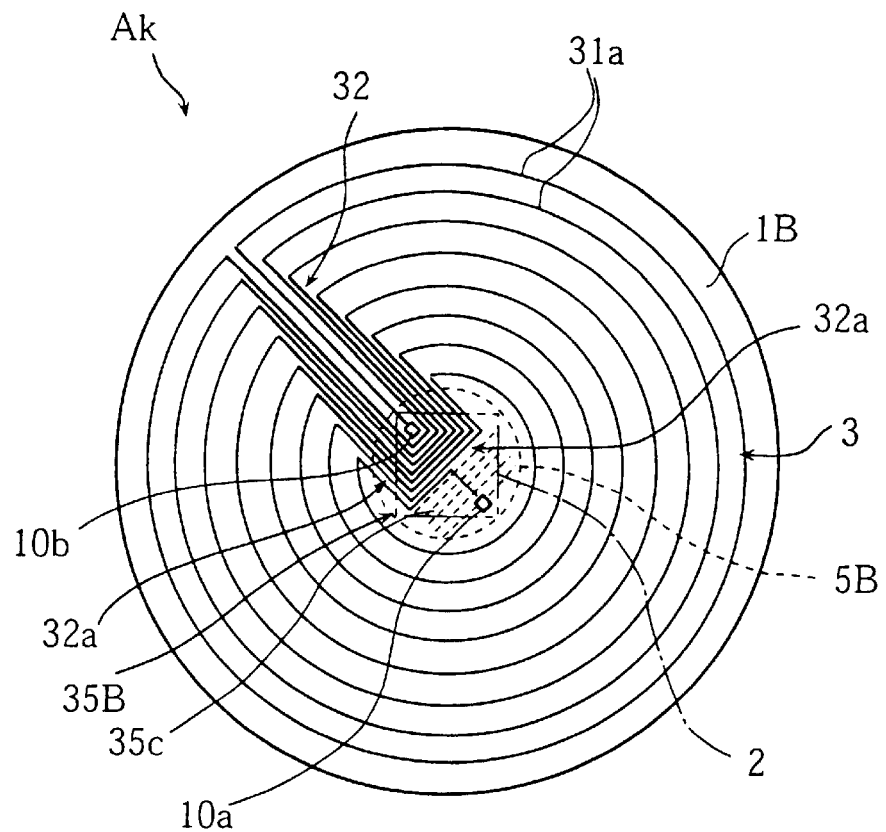
FIG. 26 is a plan view showing a further example of IC module according to the present invention.

FIG. 25 shows an IC module Aj wherein a bond assisting layer 35A is provided by a bent extension 32 of an antenna coil 3 and a dummy pattern 35b each including a plurality of curved lines. FIG. 26 shows an IC module Ak wherein a dummy pattern 35 serving as a bond assisting layer 35B includes a plurality of dotted lines. In this way, the bond assisting layer may be variously modified in configuration.

Each of the IC modules Ai to Ak is reasonable in that a part (inner end 32a) of the antenna coil 3 is utilized for improvement of the adhesion of the adhesive layer 5B. According to the present invention, the dummy pattern may be obviated, and a part of the antenna coil 3 alone may serve as a bond assisting layer. Therefore, though no means is provided which corresponds to the dummy pattern in the embodiment illustrated in FIG. 3, the inner end 32a of the antenna coil 3 shown in that figure considered as the bond assisting layer according to the present invention. Alternatively, the antenna coil 3 need not be utilized, and the bond assisting layer may, of course, be made only of an entirely different material than the antenna coil 3.

Figure 27:
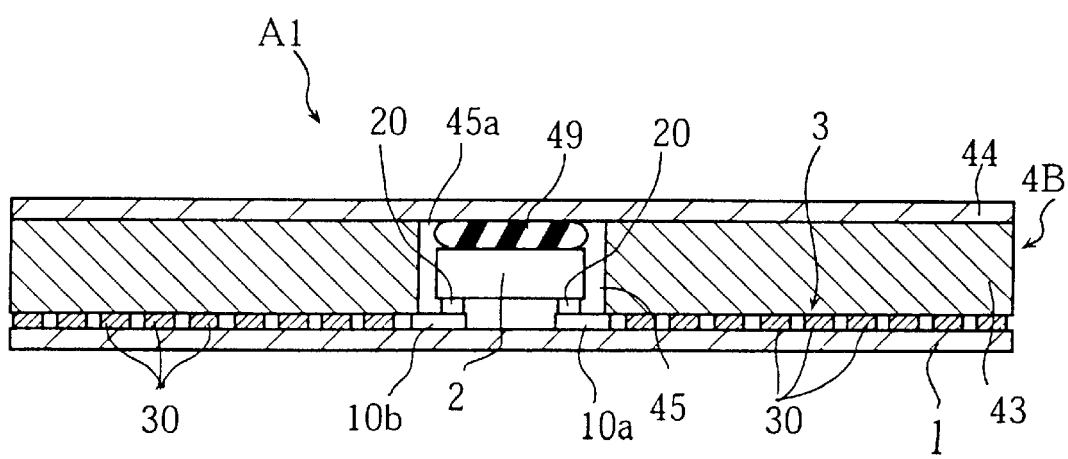
FIG. 27 is a sectional view showing a further example of IC module according to the present invention.
Figure 28:
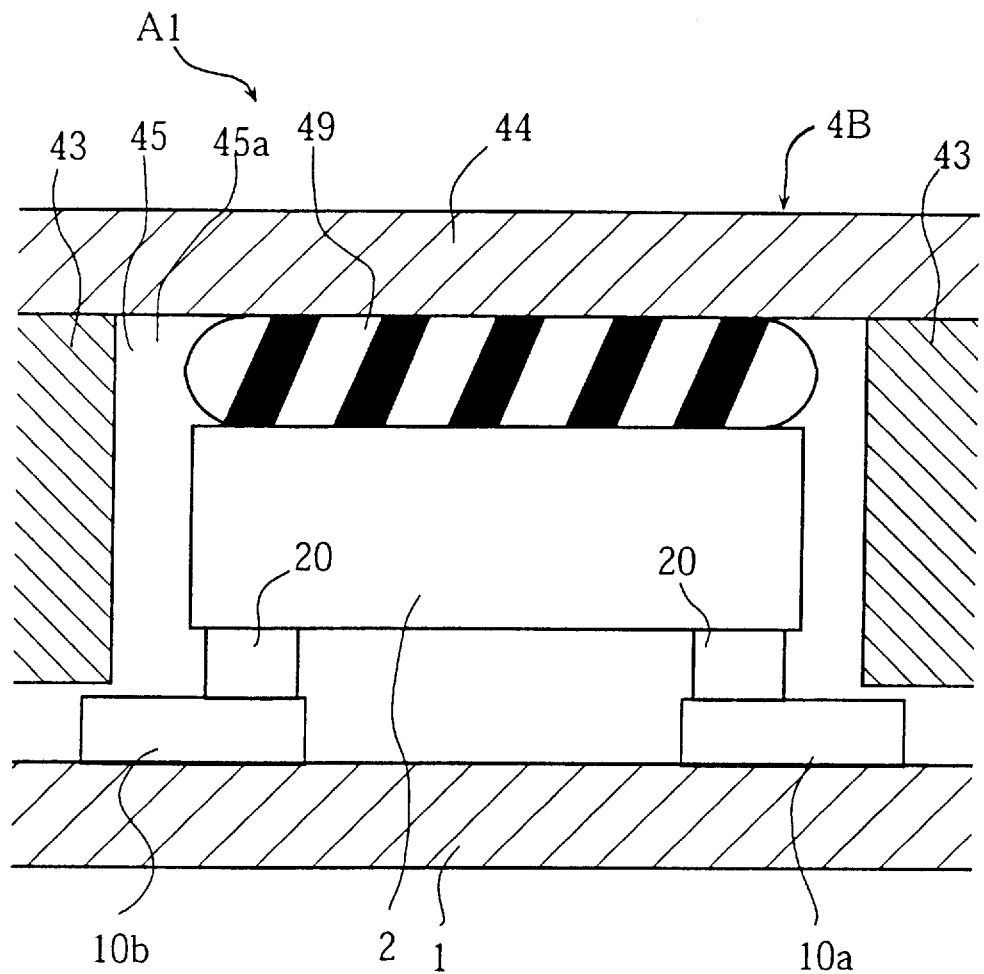
FIG. 28 is a partially enlarged sectional view of the IC module shown in FIG. 27.

An IC module Al shown in FIGS. 27 and 28 comprises a covering member 4B for covering the IC chip 2 and an elastic member 49. The covering member 4B includes a first sheet 43 having a through-hole 45a, and a second sheet 44 bonded to one surface of the first sheet 43. Since an end opening of the through-hole 45a is closed by the second sheet 44, the through-hole 45a provides a recess 45 having one open end. The first and second sheets 43, 44 are made of ABS resin for example. The thickness of the first sheet 43 is about 0.25 mm for example which is larger than the thickness of the IC chip 2. The thickness of the second sheet 44 is about 0.1 mm for example. The covering member 4B is bonded to the obverse surface of the flexible substrate 1 with the opening of the recess 45 directed downward. The IC chip 2 is housed in the recess 45 and covered by the covering member 4B. The elastic member 49 is made of a silicone rubber for example to be elastomeric. The elastic member 49 is appropriately compressed between the upper surface of the IC chip 2 and the inner top wall of the recess 45.

In the IC module Al, the IC chip 2 is always pressed against the obverse surface of the flexible substrate 1 by the elastic restoring force of the elastic member 49. Thus, the electrodes 20 of the IC chip 2 can be always pressed toward the terminals 10a, 10b even if the IC module A is somewhat deformed under bending, thereby reliably establishing conduction between the IC chip 2 and the antenna coil 3. The IC module Al does not utilizes an adhesive for mounting the IC chip 2 on the flexible substrate 1, so that an adhesive applying step may be eliminated in the manufacturing process. The covering member 4B serves to protect the IC chip 2. The covering member 4B including the two bonded sheets can be manufactured easily. However, the present invention is not limited to such a structure. For instance, the covering member may be resin-molded to have a recess, and thereafter bonded to the flexible substrate 1.

Figure 29:
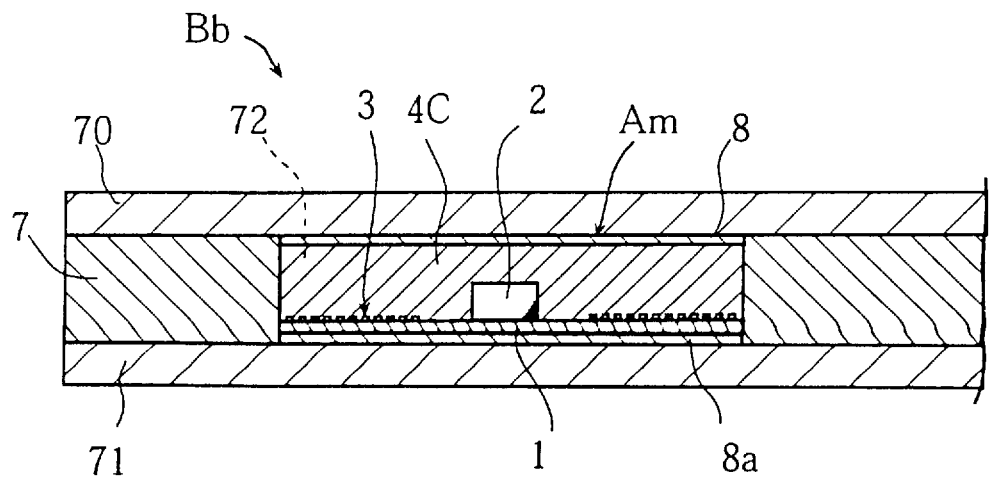
FIG. 29 is a fragmentary sectional view showing a further example of IC-card according to the present invention.
Figure 30:
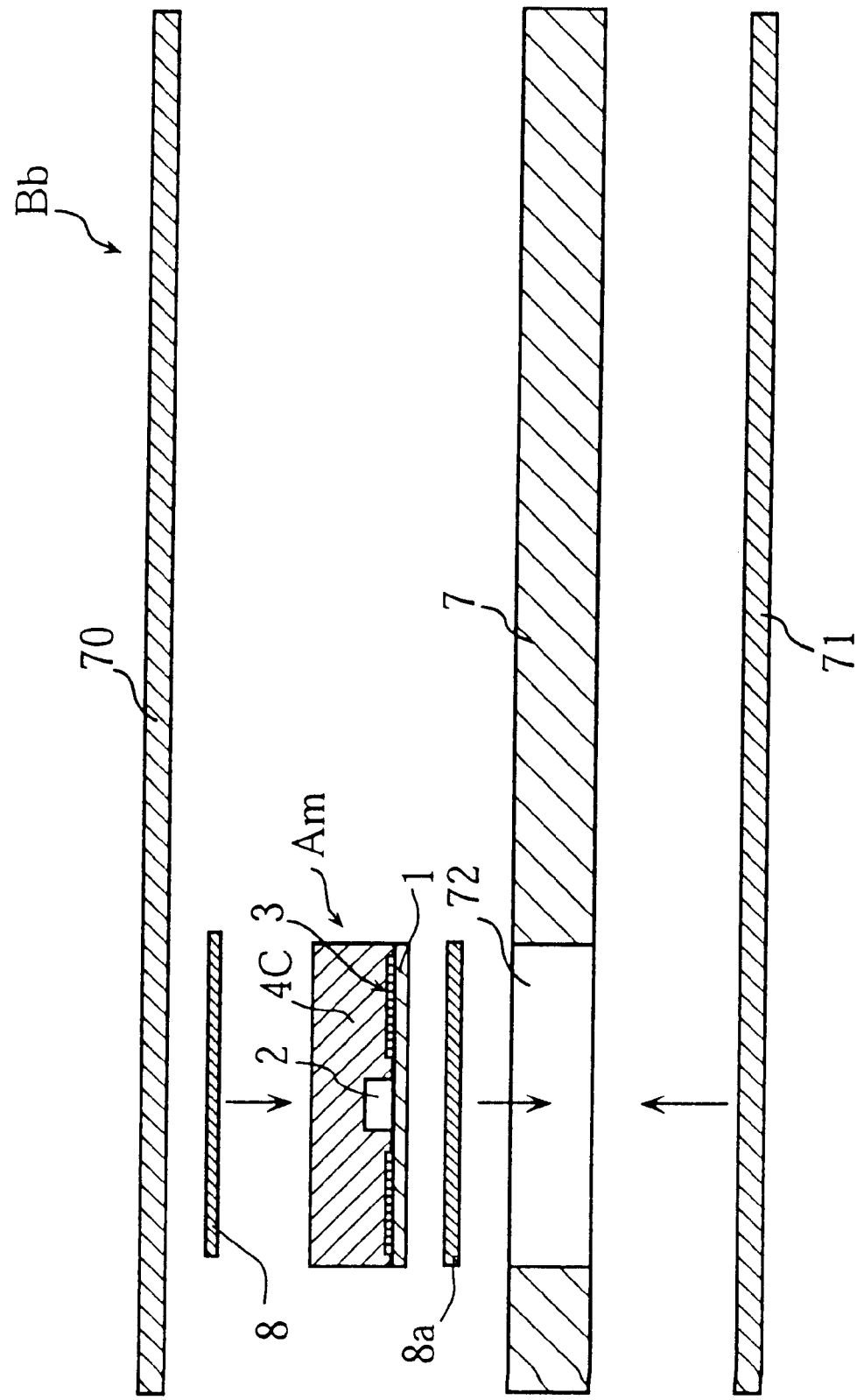
FIG. 30 is an exploded sectional view of the IC-card shown in FIG. 29.

An IC-card Bb shown in FIGS. 29 and 30 comprises flexible sheets 8, 8a each of which is provided between an IC module Am and a respective one of cover sheets 70, 71 bonded to both surfaces of a card body 7. The flexible sheets 8, 8a are housed in a receiving portion 72 together with the IC module Am. The flexible sheets 8, 8a are shaped and sized similarly to the IC module Am in plan view, and have an appropriate thickness. The flexible sheets 8, 8a have a lower modulus of elasticity than a sealing resin 4C. For example, the flexible sheets may be made of a thermosetting epoxy resin containing no filler. Both surfaces of the flexible sheet 8 are bonded to the sealing resin 4C of the IC module Am and the cover sheet 70, respectively. Both surfaces of the flexible sheet 8a are bonded to the flexible substrate 1 of the IC module A and the cover sheet 71, respectively. For bonding the flexible sheets 8, 8a to the above-mentioned portions, each of the flexible sheets 8, 8a is sandwiched between the IC module Am and a respective one of the cover sheets 70, 71 and thereafter pressed under heating for fusion.

Figure 31:
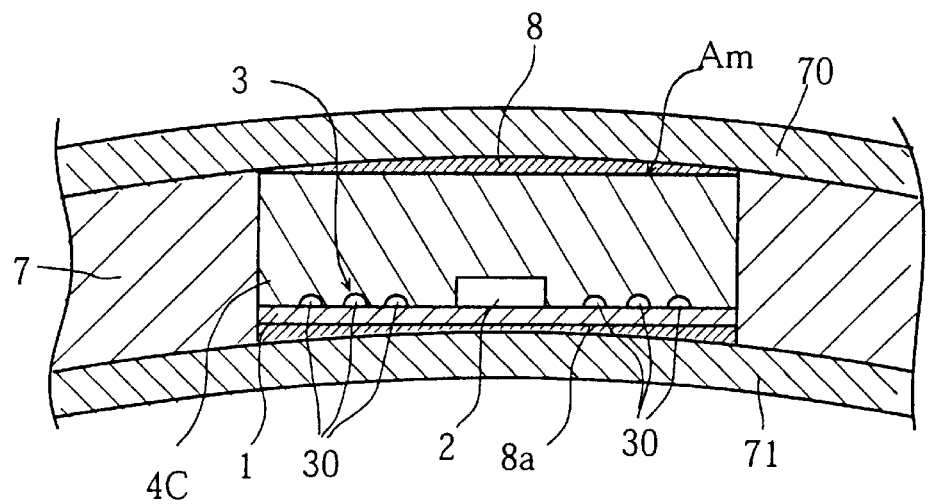
FIG. 31 is a fragmentary sectional view showing the IC-card of FIG. 29 in a bent state.

In the IC-card Bb, when the card body 7 and the two cover sheets 70, 71 are deformed under bending, the flexible sheets 8, 8a also deformed correspondingly, as shown in FIG. 31. Since the flexible sheets 8, 8a have a lower modulus of elasticity than the sealing resin 4C, they start deforming prior to deformation of the sealing resin 4C. More specifically, each of the flexible sheets 8, 8a are deformed between the IC module Am and a respective one of the cover sheets 70, 71 to increase or reduce in thickness according to the bending deformation of the cover sheets 70, 71. Such deformation of the flexible sheets 8, 8a prevents the bending force of the cover sheets 70, 71 from being directly applied to the IC module Am. As a result, it is possible to prevent the IC module Am from being greatly flexed with the same curvature of the cover sheets 70, 71, thereby protecting the IC chip 2 while preventing disconnection of the antenna coil 3.

When a flexible member is interposed between the IC module and each cover sheet for protecting the IC module as in the IC-card Bb, the flexible member does not have to be necessarily housed in the receiving portion of the cover member. For example, the flexible member may be provided over the surface between the card body and the cover sheet. In this case, the flexible member may also function to firmly bond the card body to the cover sheet, thereby effectively preventing the cover sheet from coming off the card body.

Figure 32:
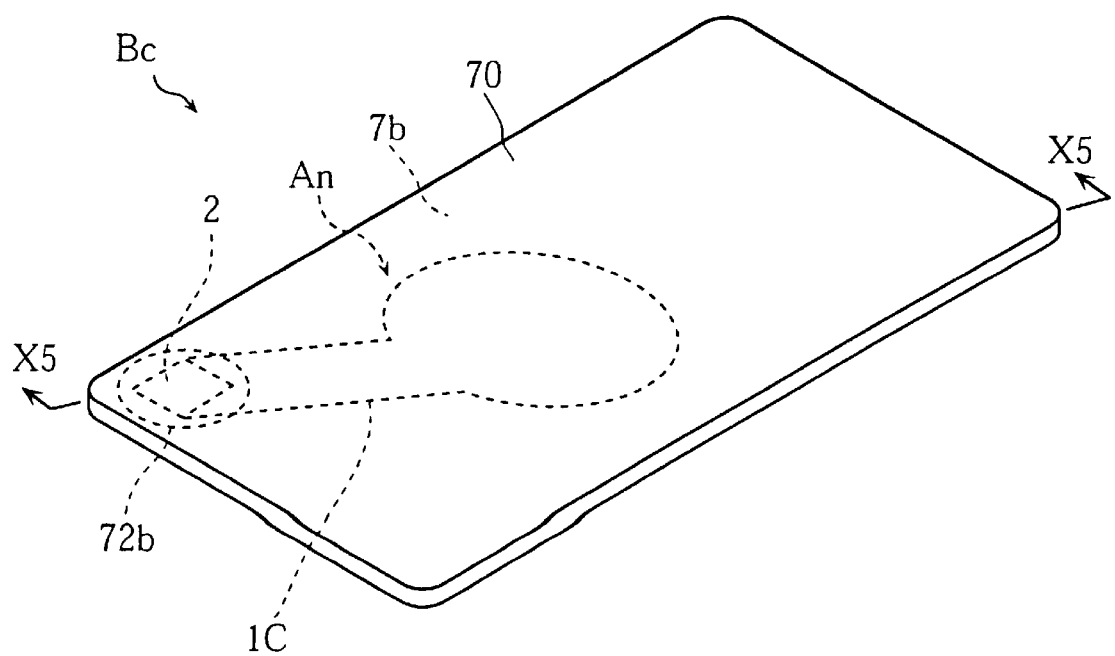
FIG. 32 is a perspective view showing a further example of IC-card according to the present invention.
Figure 33:
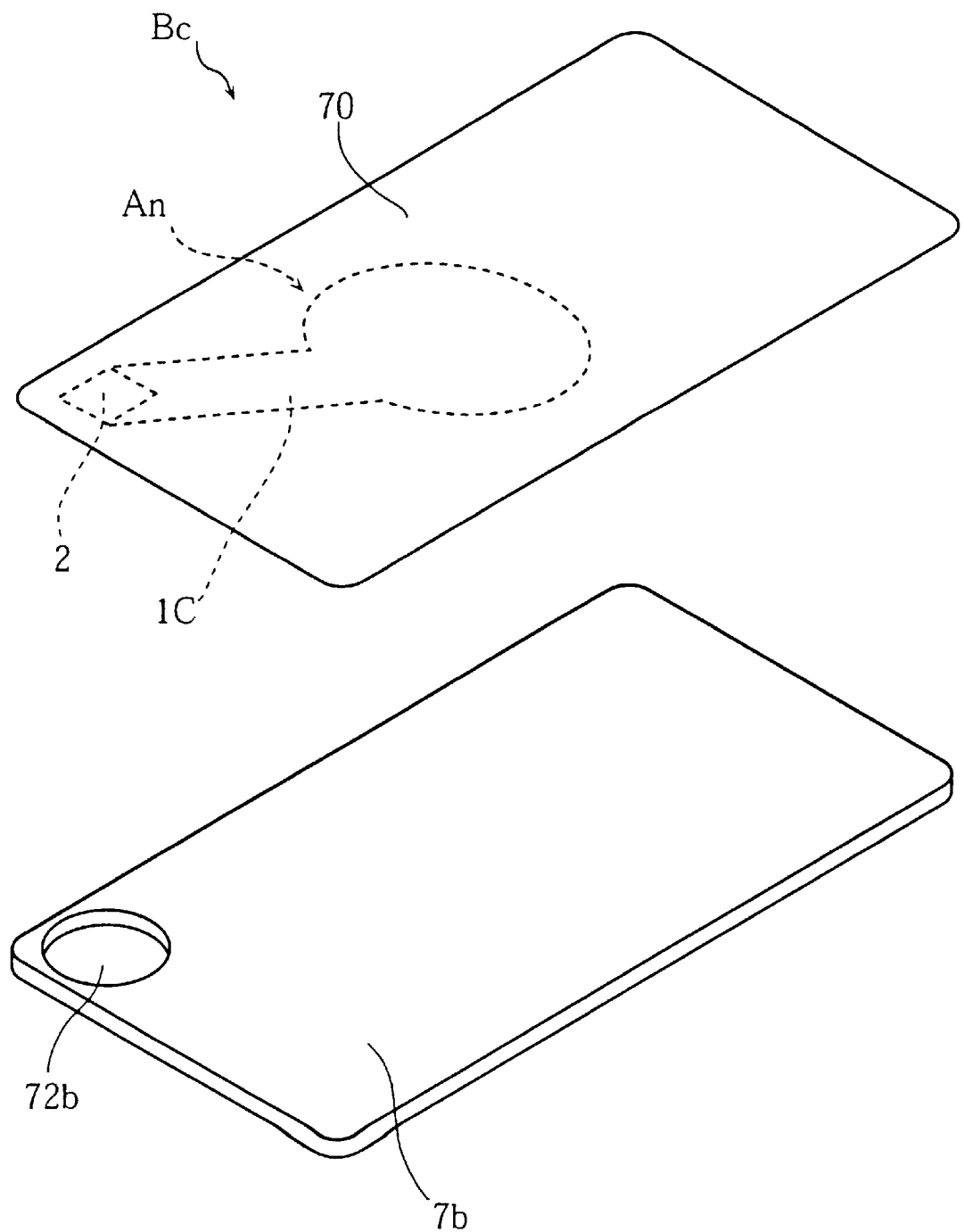
FIG. 33 is an exploded perspective view of the IC-card shown in FIG. 32.
Figure 36:
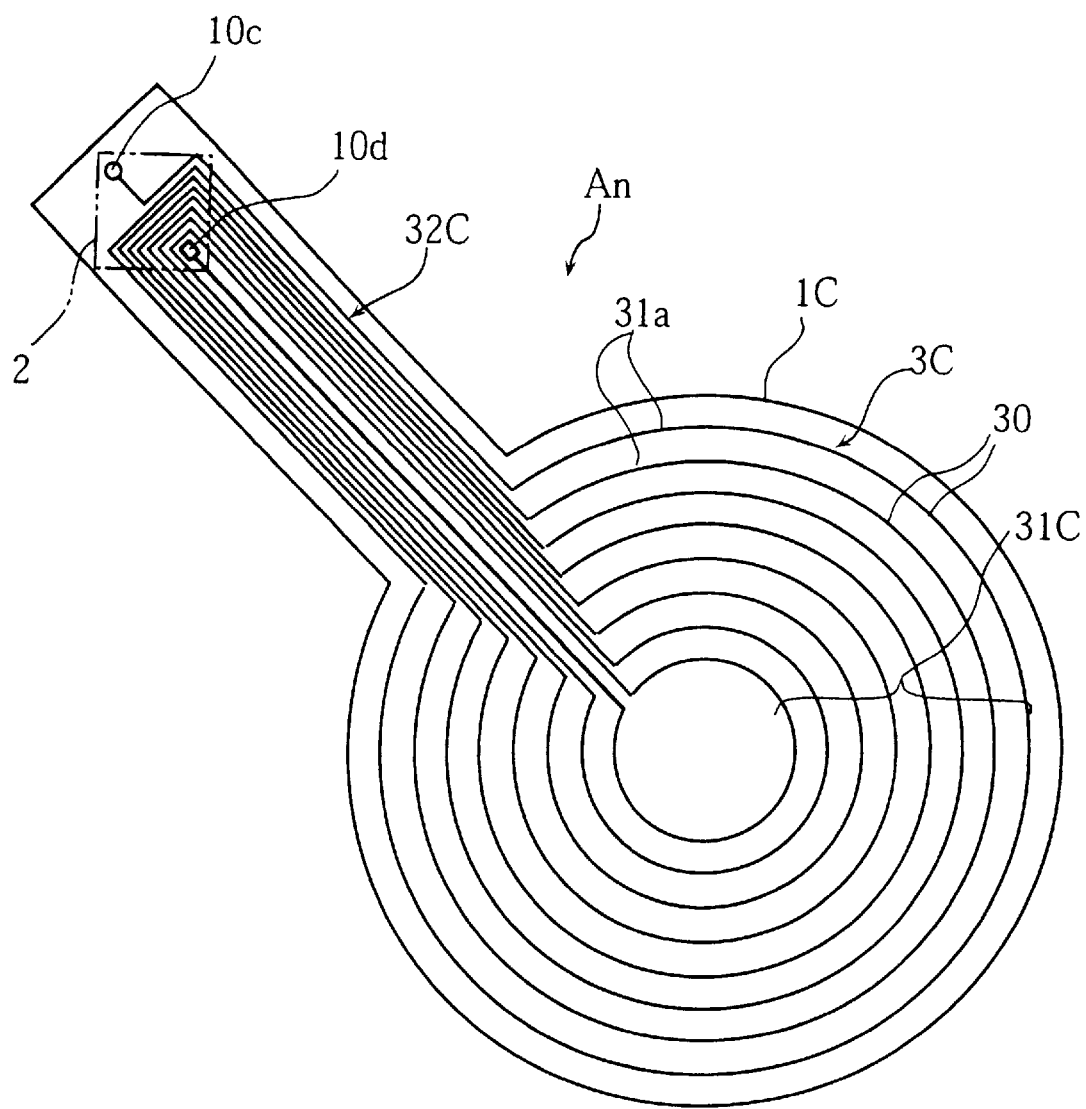
FIG. 36 is a view illustrating an IC module of the IC-card shown in FIG. 32.

An IC-card Bc shown in FIG. 32 comprises an IC module An sandwiched between a card body 7b and a cover sheet 70 bonded to the card body in overlapping relationship. As better shown in FIG. 33, the card body 7b is rectangular in plan view and has a bottomed recess 72b at one of the four corners of the card body 7b. As clearly shown in FIG. 36, the IC module An comprises an antenna coil 3C which is formed by patterning a conductive film 30 on the obverse surface of a flexible substrate 1C on which the IC chip 2 is mounted. The antenna coil 3C has a bent portion 32C extending outwardly of a spiral portion 31C from a plurality of spiral turns 31a. A pair of terminals 10c, 10d connected to the starting and terminating ends of the antenna coil 3C are disposed outside the spiral portion 31C. Accordingly, the IC chip 2 mounted in conduction with the pair of terminals 10c, 10d is also disposed outside the spiral portion 31C.

As shown in FIG. 35, the IC module An is bonded to one surface of the cover sheet 70, and the IC chip 2 is held by the cover sheet 70. As shown in FIG. 34, the IC chip 2 of the IC module An is housed in the recess 72b, and the antenna coil 3C may be located near the center of the card body 7b and the cover sheet 70 rather than the IC chip 2. A gap is provided between the outer surfaces of the IC chip 2 and the inner wall surfaces of the recess 72b for preventing the IC chip 2 from directly contacting the card body 7b.

Figure 37:
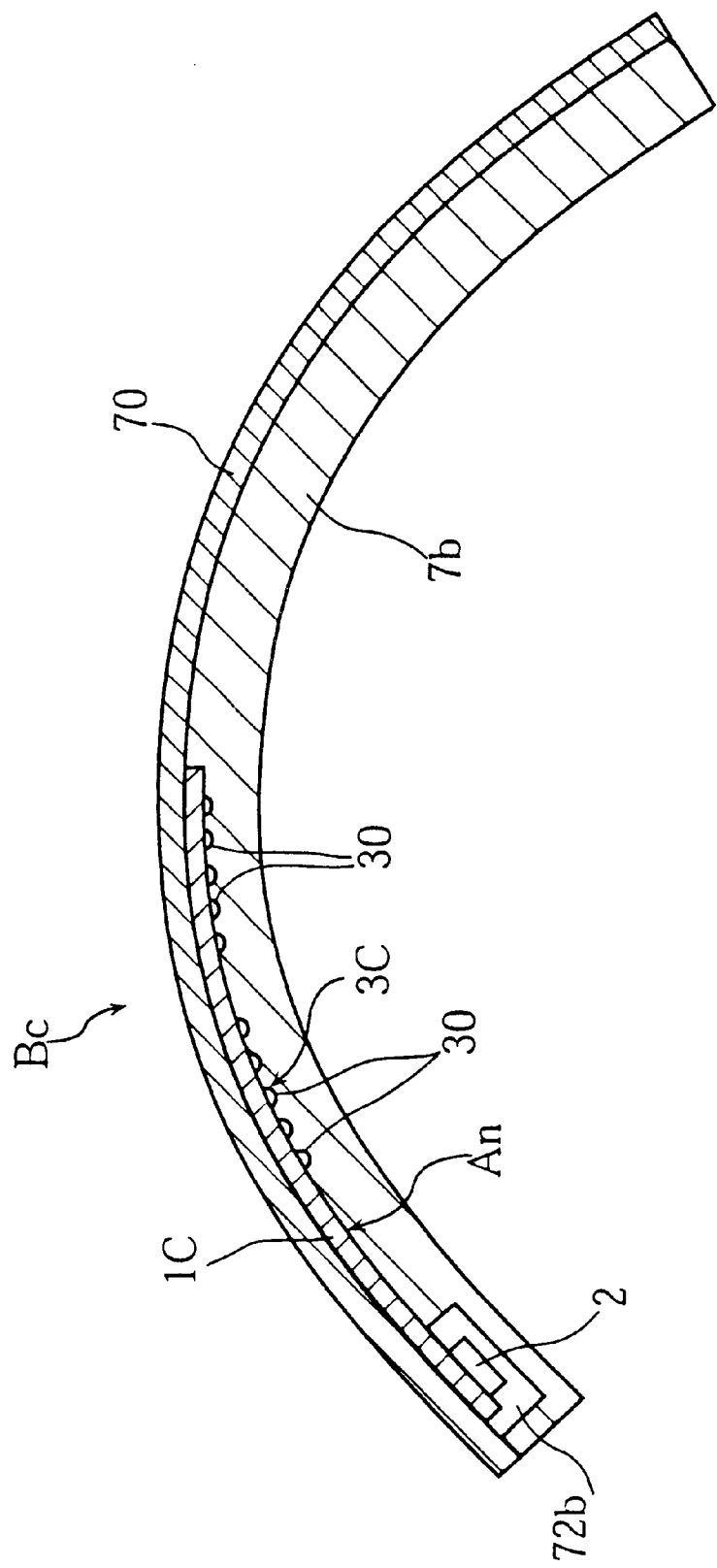
FIG. 37 is a sectional view showing the IC-card of FIG. 32 in a bent state.

As shown in FIG. 37, when the card body 7b and the cover sheet 70 of the IC-card Bc are deformed, the degree of deformation tends to be greater at a longitudinal central portion than at end portions. Therefore, it is possible to prevent the IC chip 2 from being subjected to a large stress which may resulting from the bending deformation of the card body 7b and the cover sheet 70. In particular, since the IC chip 2 is located at a corner of the card body 7b which is most difficult to flex, the IC chip 2 is more reliably prevented from being subjected to an improper stress. In this way, it is possible to protect the IC chip 2 while also preventing disconnection between the IC chip 2 and the antenna coil 3C. Even if a bending deformation occurs near the IC chip 2, the IC chip 2 is held attached to the cover sheet 70 in the recess 72b without contacting the card body 7b. Therefore, it is possible to prevent the card body 7b from strongly contacting the IC chip 2, thereby reliably protecting the IC chip 2.

In normal use of the IC-card Bc, when the antenna coil 3C receives predetermined radio waves, the spiral portion 31C of the antenna coil 3C generates an electromotive force by electromagnetic induction. However, since the IC chip 2 is located away from the spiral portion 31C, the IC chip 2 is little influenced by noises which may be caused by the electromagnetic induction, consequently reducing the likelihood of malfunction.

Figure 38:
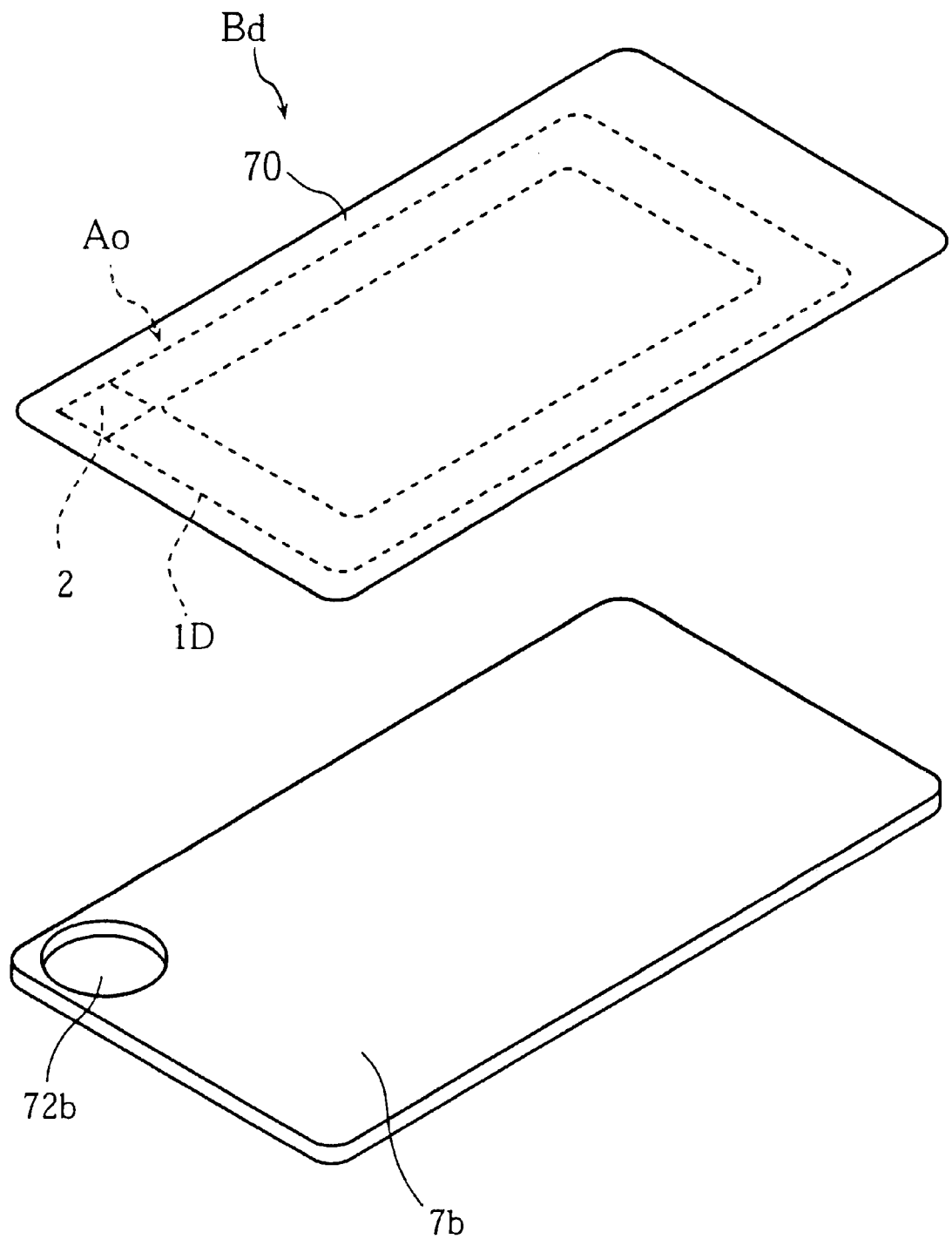
FIG. 38 is an exploded perspective view showing a further example of IC-card according to the present invention.
Figure 39:
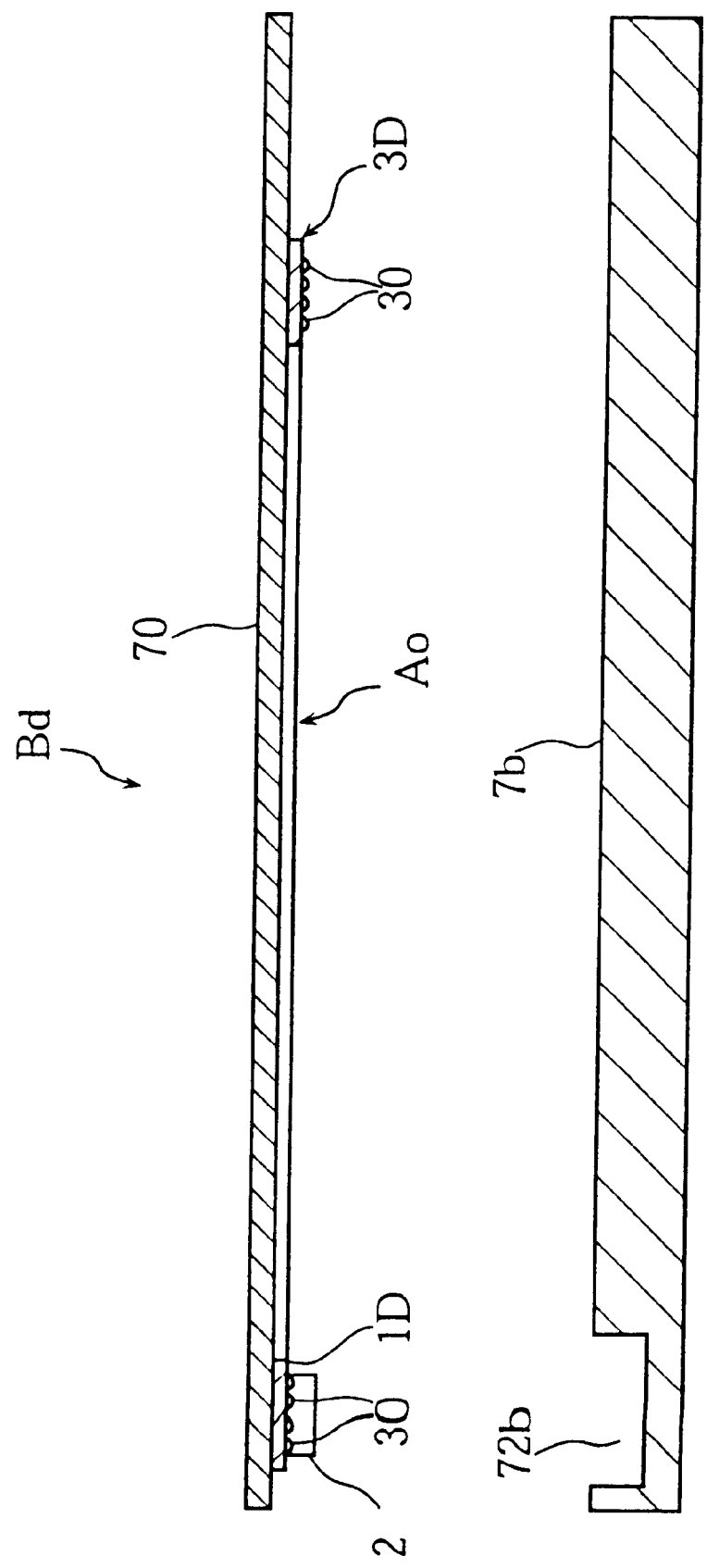
FIG. 39 is an exploded sectional view of the IC-card shown in FIG. 38.
Figure 40:
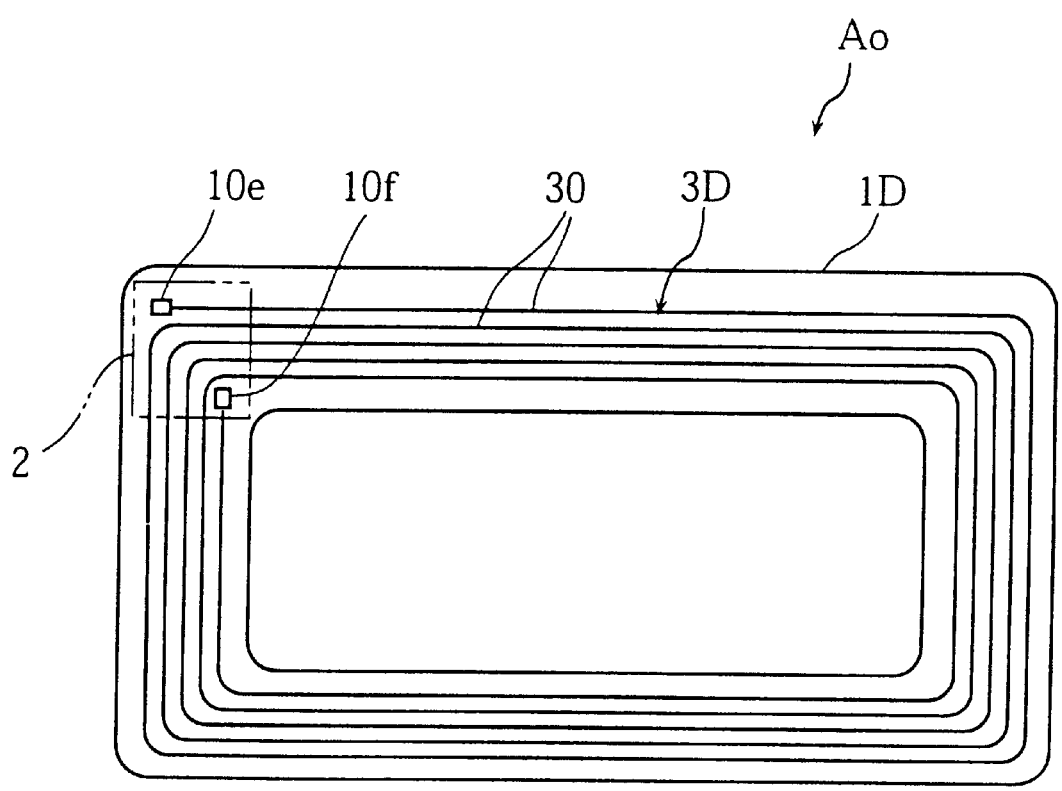
FIG. 40 is a view illustrating an IC module of the IC-card shown in FIG. 38.

FIGS. 38 and 39 show an IC-card Bd wherein an IC module Ao disposed between a card body 7b and a cover sheet 70 differs from the above-described IC module An in design. As better shown in FIG. 40, the IC module Ao includes an antenna coil 3D formed on the obverse surface of the flexible substrate 1B, and the antenna coil has a spiral portion 31D which includes a plurality of spiral turns 31d extending along a rectangular path in plan view. The flexible substrate 1B is rectangular and has an opening inwardly of the spiral portion 31D. Each of paired terminals 10e, 10f connected to the starting and terminating ends of the antenna coil 3D is disposed outside or inside, respectively, of the spiral portion 31D at a corner of the flexible substrate 1B. The IC chip 2 is provided at the above-described corner of the flexible substrate 1B in conduction with the pair of terminals 10e, 10f.

The IC module Ao is bonded to the cover sheet 70. The IC chip 2 is substantially retained by the cover sheet 70 and housed in the recess 72b at a corner of the card body 7b. A gap is formed between the inner wall surfaces of the recess 72b and the outer surfaces of the IC chip 2. Like the IC-card Bc, the IC-card Bd can prevent a damage to the IC chip 2 even if the card body 7b and the cover sheet 70 are deformed under bending. In addition, the antenna coil 3D of the IC-card Bd has a simple pattern for facilitating its manufacture. It is also easy to increase the number of turns and the winding density of the antenna coil 3D.

According to the present invention, the particular pattern of the antenna coil may be variously modified. Similarly, the particular shape of the recess 72b of the IC module An or Ao is not limitative. As a means for preventing the IC chip from being influenced by a bending deformation of the card member which comprises the card body and the cover sheet, the IC chip may be provided at a peripheral portion of the card member other than a corner thereof, instead of arranging the IC chip at or near a corner of the card member. This is because a peripheral portion of the card member deforms less than at a central portion of the card member, and therefore prevents a large damage to the IC chip.

The particular structure of the IC module and the IC chip illustrated in the above embodiments are not limitative but may be modified variously according to the present invention. For example, instead of the flexible substrate, a hard substrate with little flexibility may be used for mounting the IC chip.

INDUSTRIAL APPLICABILITY

An IC module according to the present invention may be used as a component of an IC-card. An IC-card according to the present invention may be used as a portable storage medium for storing various data.

What is claimed is:

1. An IC module comprising:

a substrate, an IC chip mounted on the substrate, and an antenna coil electrically connected to the IC chip, wherein the antenna coil includes a conductive film which is patterned on a surface of the substrate, wherein the antenna coil includes a spiral portion having a plurality of spiral turns, wherein the substrate is provided with a pair of terminals disposed inwardly of the spiral portion in connection to starting and terminating ends, respectively, of the antenna coil, wherein the IC chip has a main surface formed with a pair of electrodes for connection to the pair of terminals, wherein the antenna coil further includes a bent extension extending from the respective spiral turns, and wherein the bent extension includes a first portion inwardly from each spiral turn toward the IC chip, a second portion extending from the first portion to pass between the pair of terminals, and a third portion extending outwardly from the second portion to a next spiral turn.

2. The IC module according to claim 1, wherein the main surface of the IC chip is rectangular, the pair of electrodes for antenna connection being disposed at corners of the main surface on a common diagonal line.

3. The IC module according to claim 2, wherein the main surface of the IC chip is provided with at least one dummy electrode, the substrate being provided with a dummy terminal corresponding to the dummy electrode, the dummy electrode being connected to the dummy terminal.

4. The IC module according to claim 1, wherein the substrate comprises a flexible substrate made of a resin film as a base material.

5. An IC module comprising:

a substrate, an IC chip mounted on the substrate, an antenna coil electrically connected to the IC chip, including a conductive film which is patterned on a surface of the substrate, and an auxiliary film having a surface formed with a conductor pattern which is symmetrical or substantially symmetrical to the pattern of the antenna coil, wherein the substrate and the auxiliary film are bonded to each other to bring the conductive film pattern of the antenna coil into connection to the conductor pattern of the auxiliary film.

6. The IC module according to claim 5, wherein the film has a hole for avoiding interference of the film with the IC chip.

7. The IC module according to claim 5, wherein the substrate and the film are bonded to each other via an anisotropic conductive film comprising conductive particles dispersed in an insulating resin.

8. An IC module comprising:

a substrate, an IC chip mounted on the substrate, an antenna coil electrically connected to the IC chip, including a conductive film which is patterned on a surface of the substrate, an adhesive layer for bonding the substrate and the IC chip to each other, and a bond assisting layer disposed at a portion of the substrate for adhesion to the adhesive layer, the bond assisting layer being made of a material having a higher adhesion to the adhesive layer than the substrate.

9. The IC module according to claim 8, wherein the bond assisting layer is provided by the conductive film which also provides the antenna coil.

10. The IC module according to claim 9, wherein a part of the antenna coil provides the bond assisting layer.

11. The IC module according to claim 8, wherein the adhesive layer comprises an anisotropic conductive film including conductive particles dispersed in an insulating resin.

12. An IC module comprising:

a substrate, an IC chip mounted on the substrate, and an antenna coil electrically connected to the IC chip, including a conductive film which is patterned on a surface of the substrate, wherein the substrate has weakening means adjacent the IC chip.

13. The IC module according to claim 12, wherein the weakening means comprises a plurality of perforations penetrating through the substrate around the IC chip.

14. An IC module comprising:

a substrate, an IC chip mounted on the substrate, an antenna coil electrically connected to the IC chip, including a conductive film which is patterned on a surface of the substrate, and a sealing member for enclosing the IC chip, wherein the sealing member has weakening means.

15. The IC module according to claim 14, wherein the weakening means comprises a perforation which penetrates through the sealing member in its thickness direction.

16. The IC module according to claim 14, wherein the weakening means comprises a recess formed on an obverse surface of the sealing member.

17. The IC module according to claim 14, wherein the weakening means comprises a plurality of weakening portions arranged to surround the IC chip in plan view.

18. The IC module according to claim 14, wherein the IC chip is mounted at a central portion of the substrate, and wherein the substrate is shaped like a gear or a starfish in plan view with a plurality of projections extending radially from a portion of the substrate on which the IC chip is mounted.

19. The IC module according to claim 18, wherein the antenna coil is shaped like a gear or a starfish in plan view in conformity with the shape of the substrate.

20. The IC module according to claim 19, wherein the sealing member is shaped like a gear or a starfish in plan view in conformity with the shape of the substrate.

21. An IC module comprising:

a substrate, an IC chip mounted on the substrate, an antenna coil electrically connected to the IC chip, including a conductive film which is patterned on a surface of the substrate, and a sealing member for enclosing the IC chip, wherein the IC chip is mounted at a central portion of the substrate, the substrate being formed with a plurality of slits extending from a peripheral edge of the substrate toward the central portion.

22. An IC module comprising:

a substrate, an IC chip mounted on the substrate, an antenna coil electrically connected to the IC chip, including a conductive film which is patterned on a surface of the substrate, a covering member which is bonded to the substrate for covering the IC chip, and an elastic member interposed between the covering member and the IC chip, wherein the IC chip is pressed against the substrate by the elastic member.

23. The IC module according to claim 22, wherein the covering member has a recess for housing the IC chip.

24. The IC module according to claim 23, wherein the covering member comprises a first sheet having a through-hole, and a second sheet bonded to the first sheet to close an opening of the through-hole at one end thereof.

25. An IC-card comprising an IC module which includes a substrate, an IC chip mounted on the substrate, and an antenna coil electrically connected to the IC chip, the antenna coil comprising a conductive film which is patterned on a surface of the substrate, wherein the antenna coil includes a spiral portion having a plurality of spiral turns, wherein the substrate is provided with a pair of terminals disposed outwardly of the spiral portion in connection to starting and terminating ends, respectively, of the antenna coil, wherein the IC chip has a main surface formed with a pair of electrodes for connection to the pair of terminals, wherein the antenna coil further includes a bent extension extending from the respective spiral turns, wherein the bent extension includes a first portion outwardly from each spiral turn toward the IC chip, a second portion extending from the first portion to pass between the pair of terminals, and a third portion extending inwardly from the second portion to a next spiral turn, and wherein the IC module is incorporated in a card member.

26. The IC-card according to claim 25, wherein the card member comprises a card body having a receiving portion for housing the IC module, and at least one cover sheet bonded to the card body to close an opening of the receiving portion.

27. The IC-card according to claim 26, wherein the IC module includes a sealing member for sealing the IC chip, the sealing member having a lower modulus of elasticity than the card body.

28. The IC-card according to claim 27, wherein the substrate comprises a flexible substrate made of a flexible resin film as a base material.

29. The IC-card according to claim 26, wherein the IC module includes a sealing member for sealing the IC chip, the IC module and the cover sheet being bonded to each other via a flexible member which is lower in modulus of elasticity than the sealing member.

30. The IC-card according to claim 29, wherein the flexible member comprises a sheet made of a thermosetting resin.

31. The IC-card according to claim 26, wherein the IC chip is housed in the receiving portion of the card body with the IC chip supported by the cover sheet, a gap being formed between the IC chip and inner wall surfaces of the receiving portion.

32. The IC-card according to claim 25, wherein the IC chip is located at a peripheral portion of the card member.

33. The IC-card according to claim 32, wherein the card member is rectangular, the IC chip being located at or adjacent a corner of the card member.

34. An IC-card comprising an IC module which includes a substrate, an IC chip mounted on the substrate, and an antenna coil electrically connected to the IC chip, wherein the antenna coil includes a conductive film which is patterned on a surface of the substrate, wherein the antenna coil includes a spiral portion having a plurality of spiral turns, wherein the substrate is provided with a pair of terminals disposed inwardly of the spiral portion in connection to starting and terminating ends, respectively, of the antenna coil, wherein the IC chip has a main surface formed with a pair of electrodes for connection to the pair of terminals, wherein the antenna coil further includes a bent extension extending from the respective spiral turns, wherein the bent extension includes a first portion inwardly from each spiral turn toward the IC chip, a second portion extending from the first portion to pass between the pair of terminals, and a third portion extending outwardly from the second portion to a next spiral turn, and wherein the IC module is incorporated in a card member.

* * * * *